United States Patent
Song et al.

(10) Patent No.: US 9,490,447 B2
(45) Date of Patent: Nov. 8, 2016

(54) ORGANIC LIGHT EMITTING DIODE DISPLAY DEVICE AND METHOD OF FABRICATING THE SAME

(71) Applicant: LG DISPLAY CO., LTD., Seoul (KR)

(72) Inventors: Heon Il Song, Paju-Si (KR); Seung Han Paek, Bucheon-Si (KR); Hyo Dae Bae, Paju-Si (KR); Jong hoon Yeo, Incheon (KR); Young Mu Oh, Seoul (KR); Jeong won Lee, Goyang-Si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/790,931

(22) Filed: Jul. 2, 2015

(65) Prior Publication Data

US 2016/0005992 A1 Jan. 7, 2016

Related U.S. Application Data

(63) Continuation-in-part of application No. 14/582,822, filed on Dec. 24, 2014.

(30) Foreign Application Priority Data

| Jul. 3, 2014 | (KR) | 10-2014-0083049 |
| Aug. 29, 2014 | (KR) | 10-2014-0114184 |
| Sep. 2, 2014 | (KR) | 10-2014-0116010 |
| Dec. 5, 2014 | (KR) | 10-2014-0173863 |
| Dec. 24, 2014 | (CN) | 2014 1 0858201 |

(51) Int. Cl.
H01L 51/52 (2006.01)
H01L 27/32 (2006.01)

(52) U.S. Cl.
CPC ....... H01L 51/5221 (2013.01); H01L 51/5275 (2013.01); H01L 27/3244 (2013.01); H01L 2251/5315 (2013.01); H01L 2251/558 (2013.01); H01L 2251/562 (2013.01)

(58) Field of Classification Search
CPC .................. H01L 51/5206; H01L 51/5221
See application file for complete search history.

(56) References Cited

U.S. PATENT DOCUMENTS

| 2005/0040759 A1 | 2/2005 | Kobayashi |
| 2007/0098879 A1* | 5/2007 | Makiura ............ H01L 51/5088 427/66 |
| 2010/0301741 A1 | 12/2010 | Kim et al. |
| 2011/0101317 A1 | 5/2011 | Gregory et al. |
| 2012/0267676 A1 | 10/2012 | Satake |
| 2013/0095582 A1* | 4/2013 | Miyairi ................. H01L 51/56 438/26 |
| 2014/0184937 A1 | 7/2014 | Lim et al. |

FOREIGN PATENT DOCUMENTS

| JP | 2005-227519 A | 8/2005 |
| KR | 10-2004-0049252 A | 6/2004 |
| KR | 10-0939927 B1 | 2/2010 |
| KR | 10-2010-0065686 A | 6/2010 |

(Continued)

*Primary Examiner* — William Coleman
(74) *Attorney, Agent, or Firm* — Birch, Stewart, Kolasch & Birch, LLP

(57) ABSTRACT

An organic light emitting diode display device according to an embodiment includes: a first substrate having a pixel region; a first electrode in the pixel region on the first substrate; an emitting layer on the first electrode; and a second electrode on the emitting layer, the second electrode including a metal layer having a thickness smaller than about 300 Å.

18 Claims, 14 Drawing Sheets

(56) References Cited

FOREIGN PATENT DOCUMENTS

| | | |
|---|---|---|
| KR | 10-2010-0129596 A | 12/2010 |
| KR | 10-2011-0031900 A | 3/2011 |
| KR | 10-2012-0052851 A | 5/2012 |
| KR | 10-2013-0008160 A | 1/2013 |
| KR | 10-2014-0084961 A | 7/2014 |
| KR | 10-2014-0085326 A | 7/2014 |

* cited by examiner

ORGANIC LIGHT EMITTING DIODE DISPLAY DEVICE AND METHOD OF FABRICATING THE SAME

CROSS-REFERENCE TO RELATED APPLICATIONS

The present application is a Continuation-In-Part of co-pending U.S. application Ser. No. 14/582,822 filed Dec. 24, 2014, which is incorporated by reference. The present application also claims the benefit of priority of Korean Patent Application No. 10-2014-0083049 filed on Jul. 3, 2014, Korean Patent Application No. 10-2014-0114184 filed on Aug. 29, 2014, Korean Patent Application No. 10-2014-0116010 filed on Sep. 2, 2014, Korean Patent Application No. 10-2014-0173863 filed on Dec. 5, 2014 and Chinese Patent Application No. 201410858201.5 filed on Dec. 24, 2014, which are hereby incorporated by reference for all purposes as if fully set forth herein.

BACKGROUND OF THE INVENTION

1. Field of the Invention

The present disclosure relates to an organic light emitting diode display device and, more particularly, to an organic light emitting diode display device including a cathode improved in transmittance and electrical property and a method of fabricating the same.

2. Discussion of the Related Art

Among various flat panel displays (FPDs), an organic light emitting diode (OLED) display device has superior properties such as high luminance and low driving voltage. The OLED display device includes an anode, an emitting layer and a cathode and a light is emitted due to an energy generated when an exciton by combination of a hole and an electron in the emitting layer transitions from an excited state to a ground state.

Since an additional light source is not necessary for the OLED display device of an emissive type, a thickness and a weight of the OLED display device are reduced. In addition, since the OLED display device has superior properties such as a low power consumption, a high brightness and a high response speed, the OLED display device is regarded as the next generation display device for portable electric devices.

The OLED display device may be classified into a top emission type and a bottom emission type according to a direction of light transmission. The bottom emission type OLED display device has advantages in stability and degree of freedom of fabrication. However, since the bottom emission type OLED display device has a limitation in aperture ratio, the bottom emission type OLED display device has disadvantages in application to a high resolution display device. Accordingly, the top emission type OLED display device has been widely researched.

In the top emission type OLED display device, a light of the emitting layer is emitted through a transparent cathode to display an image. In general, the cathode is formed of a metallic material including aluminum (Al). For example, the cathode may have a sheet resistance smaller than about $10\Omega/\square$ and may have a relatively small thickness so that the light can be transmitted. However, when the cathode has a thickness of about 1000 Å to about 4000 Å for a sheet resistance smaller than about $10\Omega/\square$, the cathode has a transmittance smaller than about 1% and the light is not transmitted through the cathode. In addition, when the cathode has a thickness of about 20 Å to about 200 Å for transmission of light, the cathode has a sheet resistance of about $100\Omega/\square$ to about $10000\Omega/\square$ and the OLED display device has non-uniformity in brightness due to voltage drop.

FIG. 1 is a graph showing transmittance with respect to wavelength for four thicknesses of a cathode of a light emitting diode display device according to the related art.

In FIG. 1, a cathode of aluminum having a thickness greater than about 300 Å has a relatively low transmittance of about 15% at a wavelength of about 550 nm and an emission efficiency of an OLED display device including the cathode is reduced.

After an anode is formed, a particle of an exterior may be strongly attached to the anode. Since the particle is not removed through a cleaning step before formation of an emitting layer, the cathode may directly contact the anode such that the anode and the cathode are electrically connected. As a result, a current from a driving thin film transistor (TFT) does not flow through the emitting layer. Instead, the current directly flows from the anode to the cathode and a light is not emitted from the emitting layer. Since the corresponding pixel region may become a dark pixel displaying a black color, a power consumption increases and a display quality is deteriorated.

SUMMARY OF THE INVENTION

Accordingly, the present invention is directed to an organic light emitting diode display device and a method of fabricating the same that substantially obviate one or more of the problems due to limitations and disadvantages of the related art.

An object of the present invention is to provide a top emission type OLED display device where a transmittance and an electrical property are improved due to a cathode of a single layer or a multiple layer including silver and a method of fabricating the top emission type OLED display device.

Another object of the present invention is to provide a top emission type OLED display device where deterioration caused by a particle is prevented due to an oxide between an anode and a cathode and a method of fabricating the top emission type OLED display device.

Additional advantages, objects, and features of the invention will be set forth in the description which follows, and in part will become apparent from the description, or may be learned by practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting diode display device includes: a first substrate having a pixel region; a first electrode in the pixel region on the first substrate; an emitting layer on the first electrode, the emitting layer including an emitting material layer; a second electrode on the emitting layer, the second electrode including a metal layer having a thickness smaller than about 300 Å; and a second metal layer between the emitting material layer and the first metal layer, the second metal layer including at least one of cesium (Cs), sodium (Na), lithium (Li), tungsten (W), magnesium (Mg) and silver (Ag).

In another aspect of the present disclosure, a method of fabricating an organic light emitting diode display device includes: forming a first electrode in a pixel region on a first substrate; forming an emitting layer on the first electrode;

forming a second electrode on the emitting layer, the second electrode including a metal layer having a thickness smaller than about 300 Å; and applying a low level voltage and a high level voltage to the first and second electrodes, respectively, under one of an oxygen ambience and an ozone ambience, wherein an oxide pattern is formed between the first electrode exposed through the emitting layer and the second electrode by the low level voltage and the high level voltage.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) in accordance with the invention and together with the description serve to explain the principles of the embodiments in accordance with the invention. In the drawings.

DETAILED DESCRIPTION OF THE ILLUSTRATED EMBODIMENTS

Reference will now be made in detail to exemplary embodiments, examples of which are illustrated in the accompanying drawings. The same reference numbers may be used throughout the drawings to refer to the same or like parts. In the following description, detailed descriptions of known functions and configurations incorporated herein will be omitted when it may obscure the subject matter of the present embodiments.

Hereinafter, the embodiments of the present invention will be described in detail with reference to FIGS. 2 to 14D. All the components of display devices according to the embodiments of the present invention are operatively coupled and configured.

Figure 1:
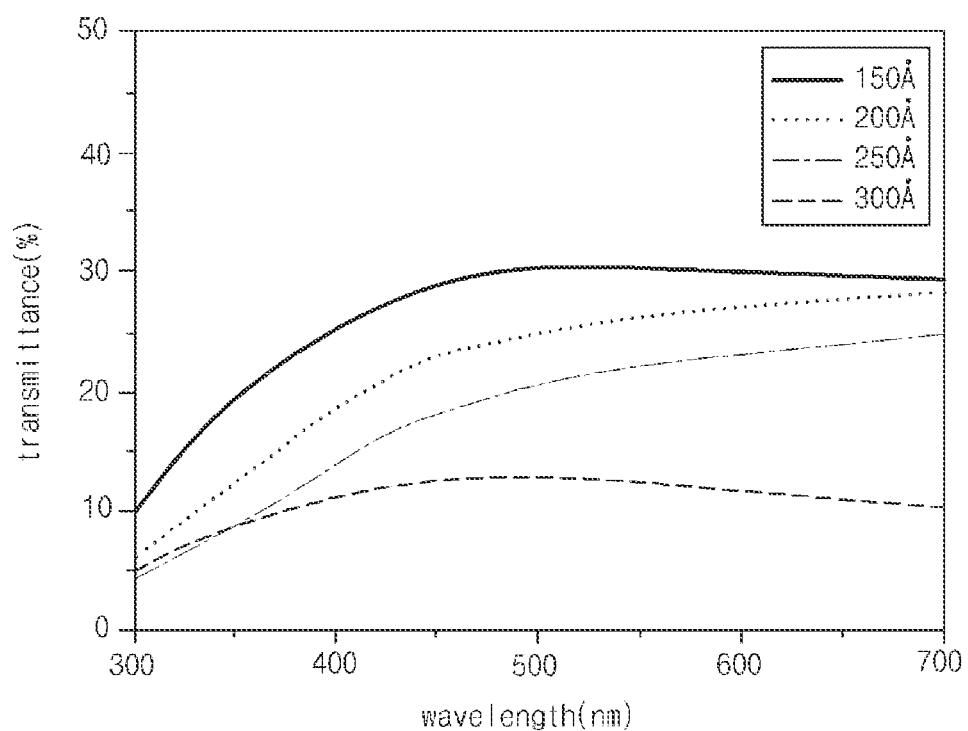
FIG. 1 is a graph showing transmittance with respect to wavelength for four thicknesses of a cathode of a light emitting diode display device according to the related art.
Figure 2:
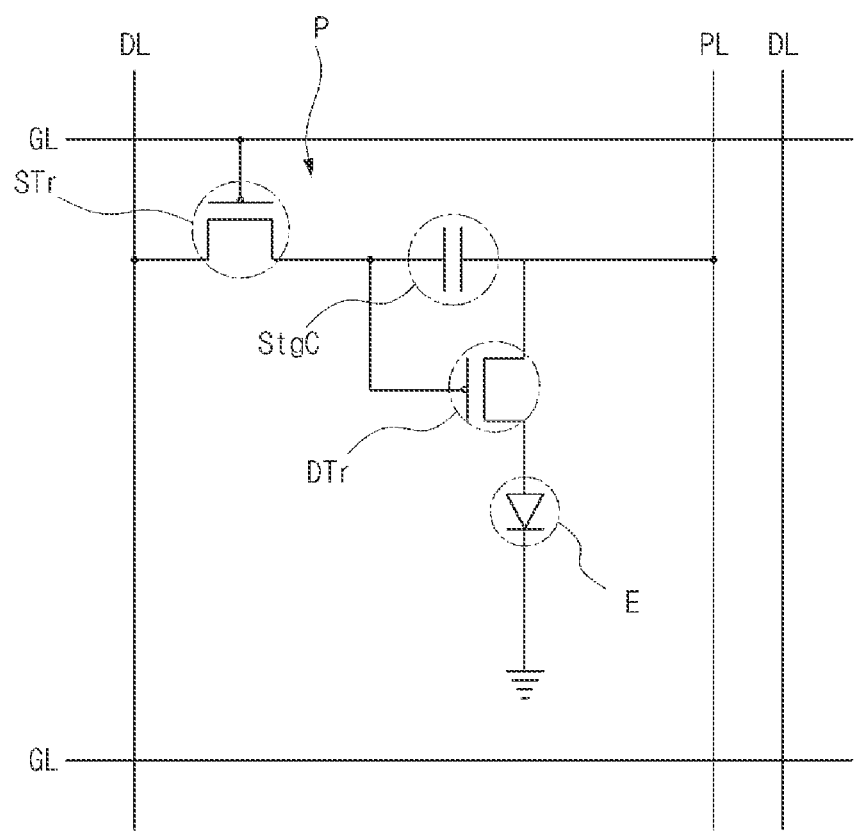
FIG. 2 is a view showing a pixel region of an organic light emitting diode display device according to a first embodiment of the present invention.

FIG. 2 is a view showing a pixel region of an organic light emitting diode display device according to a first embodiment of the present invention.

In FIG. 2, a gate line GL crosses a data line DL and a power line PL to define a pixel region P and a switching thin film transistor (TFT) STr, a driving TFT DTr, a storage capacitor StgC and a light emitting diode E are formed in the pixel region P. The switching TFT STr is connected to the gate line GL and the data line DL and the driving TFT DTr connected to the switching TFT STr. A first electrode of the light emitting diode E is connected to a drain electrode of the driving TFT DTr and a second electrode of the light emitting diode E is grounded. The power voltage of the power line PL is applied to the light emitting diode E through the driving TFT DTr. The storage capacitor StgC is connected between a gate electrode and a source electrode of the driving TFT DTr.

When a gate signal is supplied to the gate line GL, the switching TFT STr is turned on and a data signal of the data line DL is applied to the gate electrode of the driving TFT DTr. As a result, the driving TFT DTr is turned on and the light emitting diode E emits a light.

When the driving TFT DTr is turned on, a level of a current of the light emitting diode E through the power line PL is determined so that the light emitting diode E can display a gray scale. The storage capacitor StgC keeps a voltage of the gate electrode of the driving TFT DTr constant while the switching TFT STr is turned off. Accordingly, the level of the current of the light emitting diode E may be kept constant till a next frame even when the switching TFT STr is turned off.

Figure 3:
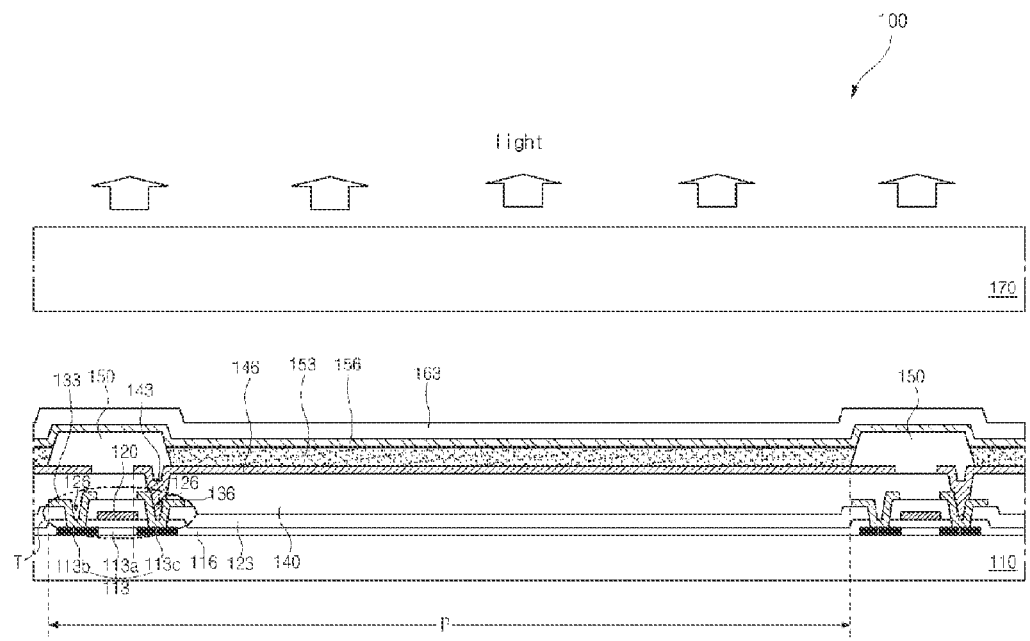
FIG. 3 is a cross-sectional view showing an organic light emitting diode display device according to a first embodiment of the present invention.

FIG. 3 is a cross-sectional view showing an organic light emitting diode display device according to a first embodiment of the present invention.

In FIG. 3, an organic light emitting diode (OLED) display device 100 of a top emission type includes a first substrate 110 and a second substrate 170 for encapsulation, and a switching thin film transistor (TFT) STr (of FIG. 2), a driving TFT DTr and a light emitting diode E are formed on an inner surface of the first substrate 110. The second substrate 170 may be omitted in another embodiment by forming an inorganic insulating layer or an organic insulating layer on a top surface of the first substrate 110. The first substrate 110 may be referred to as an array substrate and the second substrate 170 may be referred to as an encapsulation substrate.

A semiconductor layer 113 including an active region 113a at a central portion thereof and a source region 113b and a drain region 113c at both sides of the active region 113a is formed on the first substrate 110. The active region 113a may be formed of an intrinsic polycrystalline silicon to function as a channel, and the source region 113b and the drain region 113c may be formed of an impurity-doped polycrystalline silicon to function as a source and a drain. A buffer layer of an inorganic insulating material such as silicon oxide ($SiO_2$) and silicon nitride ($SiN_x$) may be formed between the first substrate 110 and the semiconductor layer 113. The buffer layer may be formed between the first substrate 110 and the semiconductor layer 113 to prevent deterioration of the semiconductor layer 113 due to alkali ions erupting from the first substrate 110 during a crystallization process for the semiconductor layer 113.

A gate insulating layer 116 is formed on the semiconductor layer 113, and a gate electrode 120 is formed on the gate insulating layer 116 over the active region 113a of the semiconductor layer 113. In addition, a gate line GL (of FIG. 2) connected to a gate electrode of the switching TFT STr is formed on the gate insulating layer 116.

An interlayer insulating layer 123 of an inorganic insulating material such as silicon oxide ($SiO_2$) and silicon nitride ($SiN_x$) is formed on the gate electrode 120 and the gate line GL. The interlayer insulating layer 123 and the gate insulating layer 116 have semiconductor contact holes 126 exposing the source region 113b and the drain region 113c of the semiconductor layer 113.

A data line DL (of FIG. 2) and a power line PL (of FIG. 2) crossing the gate line GL are formed on the interlayer insulating layer 123. In addition, a source electrode 133 and a drain electrode 136 spaced apart from each other are formed on the interlayer insulating layer 123. The source electrode 133 and the drain electrode 136 are connected to the source region 113b and the drain region 113c, respectively, of the semiconductor layer 113 through the semiconductor contact holes 126.

The semiconductor layer 113, the gate insulating layer 116, the gate electrode 120, the interlayer insulating layer 123, the source electrode 133 and the drain electrode 136 constitute the driving TFT DTr. The switching TFT STr may have the same structure as the driving TFT DTr. The switching TFT STr is connected to the gate line GL, the data line DL and the driving TFT DTr.

Although the switching TFT STr and the driving TFT DTr have a top gate type including the semiconductor layer 113 of polycrystalline silicon in the first embodiment, the switching TFT STr and the driving TFT DTr may have a bottom gate type including a semiconductor layer of amorphous silicon or an oxide semiconductor material in another embodiment.

The switching TFT and the driving TFT of a bottom gate type may include a gate electrode, a gate insulating layer on the gate electrode, a semiconductor layer having an active layer of intrinsic amorphous silicon and an ohmic contact layer of impurity-doped amorphous silicon on the gate insulating layer over the gate electrode, and source and drain electrodes on the ohmic contact layer. Alternatively, the switching TFT and the driving TFT of a bottom gate type may include a gate electrode, a gate insulating layer on the gate electrode, a semiconductor layer of an oxide semiconductor layer on the gate insulating layer over the gate electrode, an etch stopper on the semiconductor layer, and source and drain electrodes on the etch stopper.

In the first substrate having the switching TFT and the driving TFT of a bottom gate type, the gate line may have the same layer as the gate electrode to be connected to the gate electrode of the switching TFT, and the data line may have the same layer as the source electrode and the drain electrode to be connected to the source electrode of the switching TFT.

A passivation layer 140 is formed on the switching TFT STr and the driving TFT DTr. The passivation layer 140 includes a drain contact hole 143 exposing the drain electrode 136 of the driving TFT DTr. The passivation layer 140 may be formed of an organic insulating material such as photo acryl to have a flat top surface. In another embodiment, an additional passivation layer of an inorganic insulating material may be formed between the switching TFT STr and the driving TFT DTr and the passivation layer 140, and the passivation layer 140 and the additional passivation layer may include the drain contact hole 143.

A first electrode 146 is formed on the passivation layer 140 in the pixel region P. The first electrode 146 is connected to the drain electrode 136 of the driving TFT DTr through the drain contact hole 143. The first electrode 146 may be formed of a material having a relatively high work function to function as an anode supplying a hole to the emitting layer 153. For example, the first electrode 146 may be formed of a transparent conductive material such as indium-tin-oxide (ITO) and indium-zinc-oxide (IZO).

Although the first electrode 146 has a single-layered structure in the first embodiment, the first electrode 146 may have a multiple-layered structure in another embodiment. For example, an uppermost layer of the first electrode 146 may be formed of a transparent conductive material, and one of the other layers of the first electrode 146 may be formed of a metallic material having a relatively high reflectance.

A bank layer 150 is formed on the first electrode 146 at a boundary portion of the pixel region P. The bank layer 150 covers an edge portion of the first electrode 146 and exposes a central portion of the first electrode 146 to form an open portion. The bank layer 150 may have a single-layered structure including a hydrophobic material or may have a double-layered structure of a first layer including a hydrophilic material and a second layer including a hydrophobic material.

An emitting layer 153 is formed on the first electrode 146 exposed through the open portion of the bank layer 150. The emitting layer 153 may emit one of red, green and blue colored lights in the pixel region P. Although not shown, the emitting layer 153 may include a hole injecting layer (HIL), a hole transporting layer (HTL), an emitting material layer (EML), an electron transporting layer (ETL) and an electron injecting layer (EIL). The hole injecting layer and the electron injecting layer reduce barriers of a hole injecting energy and an electron injecting energy so that a hole and an electron can be effectively transmitted to the emitting material layer and a driving voltage can be reduced.

A second electrode 156 is formed on the emitting layer 153. The second electrode 156 may include a metal layer of silver (Ag) to have a relatively low work function to function as a cathode supplying an electron to the emitting layer 153. The second electrode 156 may be formed on an entire surface of the first substrate 110. When the second electrode 156 includes the metal layer of silver, the emitting layer 153 may include at least one of cesium (Cs), sodium (Na), lithium (Li), tungsten (W) and magnesium (Mg) as the electron injecting layer.

The first electrode 146, the emitting layer 153 and the second electrode 156 constitute a light emitting diode E.

A capping layer 163 is formed on the second electrode 156 of the light emitting diode E. The capping layer 163 may be formed of a material having a refractive index greater than about 1.5 to maximize a surface plasmon effect and a complex refractive index. For example, the capping layer 163 may be formed of one of an inorganic material, an organic material and a metal oxide. The capping layer 163 covers the light emitting diode E to prevent penetration of moist to the emitting layer 153. In addition, the capping layer 163 may minimize reflectance of external light at the second electrode 156 and may maximize transmittance through the second electrode 156. The capping layer 163 may be omitted in another embodiment.

The second substrate 170 is attached to the first substrate 110 using a seal pattern of an edge region or a seal layer of an entire region. The seal pattern or the seal layer may cover and protect the driving TFT DTr and the light emitting diode E. For example, the seal pattern or the seal layer may include a light curable resin or a heat curable resin.

The first substrate 110 may be formed of one of glass, plastic, stainless steel and metal foil, and the second substrate 170 may be formed of glass. A space between the first and second substrates 110 and 170 may be filled with one of air, nitrogen gas and adhesive.

In the OLED display device 100 of a top emission type, when a high level voltage and a low level voltage are applied to the first electrode 146 and the second electrode 156, respectively, of the light emitting diode E, the hole from the first electrode 146 and the electron from the second electrode 156 are transmitted to the emitting layer 153 to generate an exciton. When the exciton transitions from an excited state to a ground state, a light is emitted from the emitting layer 153.

The light from the emitting layer 153 passes through the second electrode 156 to display an image. As a result, the second electrode 156 includes a metal layer of silver (Ag) to have a relatively low sheet resistance and a relatively high transmittance. For example, the second electrode 156 may have a thickness of about 150 Å to about 250 Å. Since the transmission of the second electrode 156 is maximized and the voltage drop of the second electrode 156 is minimized, emission efficiency and uniformity in brightness of the OLED display device 100 are improved.

Figure 4:
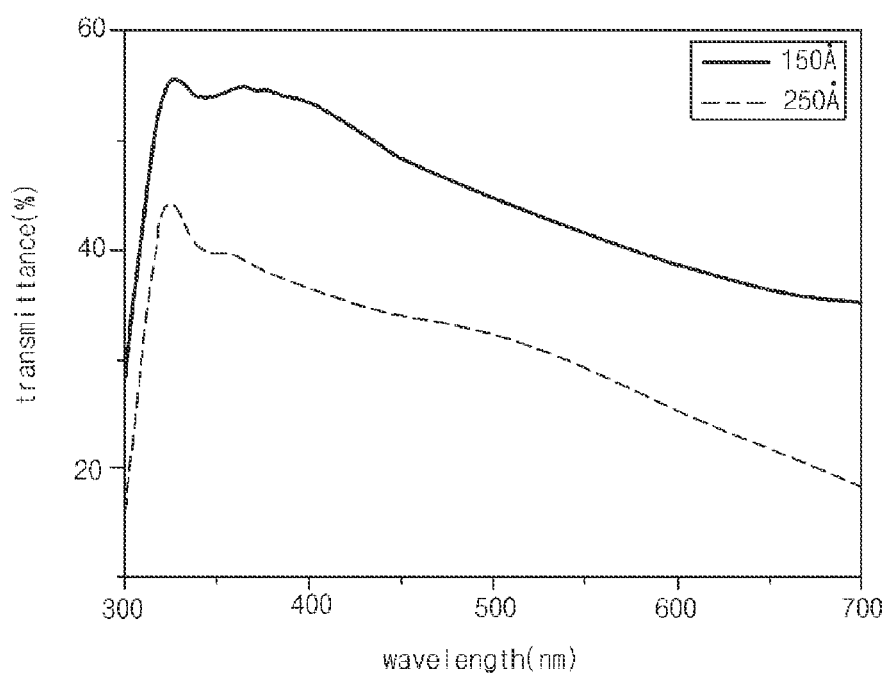
FIG. 4 is a graph showing a transmittance with respect to a wavelength for two thicknesses of a second electrode of an organic light emitting diode display device according to a first embodiment of the present invention.

FIG. 4 is a graph showing a transmittance with respect to a wavelength for two thicknesses of a second electrode of an organic light emitting diode display device according to a first embodiment of the present invention, and TABLE 1 below illustrates a sheet resistance with respect to a thickness of a second electrode of an organic light emitting diode display device according to a first embodiment of the present invention.

TABLE 1

| thickness of second electrode(□) | 150 | 200 | 500 |
|---|---|---|---|
| sheet resistance(Ω/□) | 7.0 | 3.4 | 1.5 |

In FIG. 4 and TABLE 1, when the second electrode 156 of silver has a thickness of about 150 Å to about 250 Å, the second electrode 156 of silver has a sheet resistance smaller than about 10Ω/□ and has an average transmittance of about 50% at a wavelength of about 380 nm to about 650 nm. Accordingly, the metal layer of silver may be used for the second electrode 156.

The metal layer of silver for the second electrode 156 may have a thickness of about 150 Å to about 250 Å. When the thickness of the metal layer of silver is smaller than about 150 Å, the metal layer of silver may have a sheet resistance greater than about 10Ω/□. In addition, since the metal layer of silver having a thickness smaller than about 150 Å may have a non-uniform thickness, the metal layer of silver can not be used for the second electrode 156. When the thickness of the metal layer of silver is greater than about 250 Å, the metal layer of silver may have an average transmittance smaller than about 30%. As a result, the metal layer of silver having a thickness greater than about 250 Å can not be used for the second electrode 156.

In the OLED display device 100 of a top emission type, when the first and second electrodes 146 and 156 directly contact each other due to a particle PTL (of FIG. 7A), an electrical shortage between the first and second electrodes 146 and 156 is prevented due to a subsequent aging step. Accordingly, increase in power consumption and decrease in display quality due to deterioration such as a dark pixel are prevented.

Figure 5:
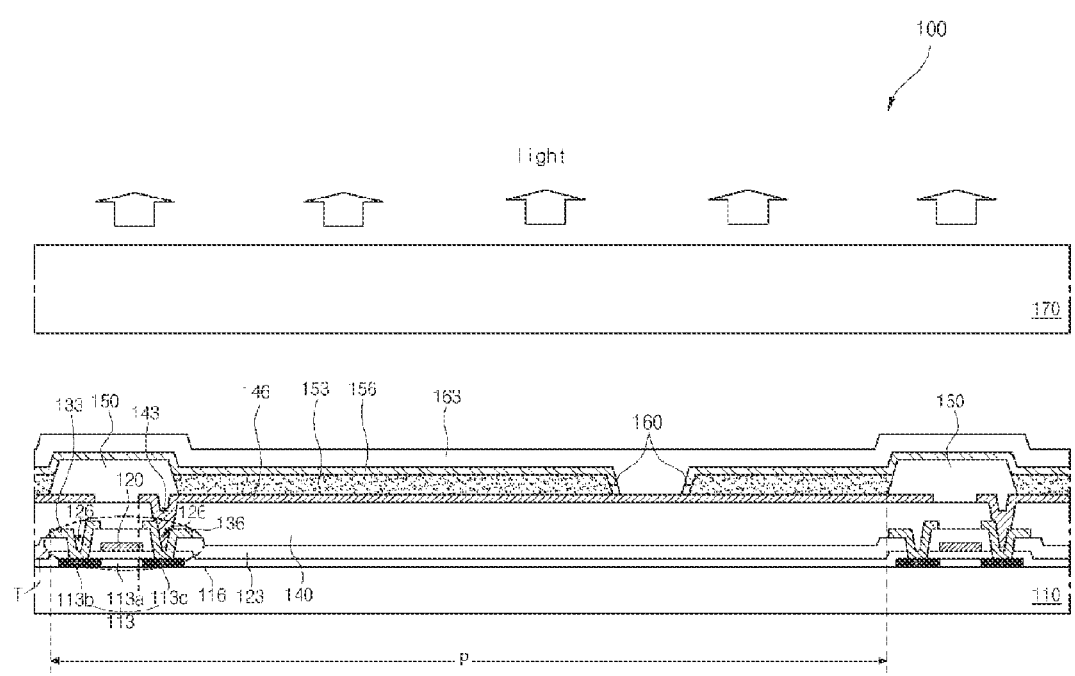
FIG. 5 is a cross-sectional view showing an organic light emitting diode display device having an oxide layer according to a first embodiment of the present disclosure.

FIG. 5 is a cross-sectional view showing an organic light emitting diode display device having an oxide layer according to a first embodiment of the present invention. FIG. 5 shows an organic light emitting diode (OLED) display device 100 where a particle is removed after an aging step, and illustrations for the same portion as FIG. 3 will be omitted.

In FIG. 5, the driving TFT DTr and the light emitting diode E are formed on the first substrate 110, and the first substrate 110 is encapsulated by the second substrate 170.

The driving TFT DTr includes the semiconductor layer 113, the gate insulating layer 116, the source electrode 133 and the drain electrode 136. The passivation layer 140 is formed on the driving TFT DTr and the light emitting diode E is formed on the passivation layer 140.

The light emitting diode E includes the first electrode 146 of an anode, the emitting layer 153 and the second electrode 156 of a cathode. The first electrode 146 is disposed in the pixel region P and the bank layer 150 is formed at the boundary region of the pixel region P.

After the first electrode 146 and the bank layer 150 are formed, a particle PTL from an exterior may be strongly attached to the first electrode 146. When the particle PTL is not removed through a cleaning step before formation of the emitting layer 153, the emitting layer 153 may be formed on the first electrode 146 and the particle PTL such that the emitting layer 153 on the first electrode is separated from the emitting layer 153 on the particle PTL. As a result, the first electrode 146 at a periphery of the particle PTL is exposed through the emitting layer 153.

Subsequently, when the second electrode 156 is formed on the first substrate 110 having the emitting layer 153, the second electrode 156 may be formed on the emitting layer 153 and on the first electrode 146 exposed due to the particle PTL. As a result, the second electrode 156 directly contacts the first electrode 146 exposed due to the particle PTL.

After the second electrode 156 including the metal layer of silver is formed, an oxide pattern 160 is formed by oxidizing a portion of the second electrode 156 directly contacting the first electrode 146 through an aging step. As a result, an electrical shortage between the first and second electrodes 146 and 156 is prevented. For example, the oxide pattern 160 of silver oxide may be formed between the first and second electrodes 146 and 156 directly contacting each other, and the first and second electrodes 146 and 156 may be electrically insulated.

Accordingly, an electrical shortage between the first and second electrodes 146 and 156 is prevented even when the first and second electrodes 146 and 156 directly contact each other due to the particle PTL. In addition, increase in power consumption and decrease in display quality due to deterioration such as a dark pixel are prevented.

In the aging step, a reverse bias is applied to the first and second electrodes 146 and 156 under an oxygen ($O_2$) ambience or an ozone ($O_3$) ambience. For example, a high level voltage and a low level voltage may be applied to the second electrode 156 and the first electrode 146, respectively. A portion of the second electrode 156 is oxidized due to a heat generated by the reverse bias to form the oxide pattern 160 of silver oxide. Although silver may not be easily oxidized even when silver is exposed to the air for a relatively long time period, a surface of silver may be oxidized when the oxygen or the ozone of high purity and the heat are applied to silver.

In the OLED display device 100 of a top emission type, the second electrode 156 is formed to include the metal layer of silver, and the reverse bias is applied to the first and second electrodes 146 and 156 under the oxygen ambience or the ozone ambience of high purity when the first and second electrodes 146 and 156 directly contact each other due to the particle PTL. Accordingly, a portion of the second electrode 156 directly contacting the first electrode 146 is oxidized to form the oxide pattern 160 of silver oxide. Since the portion where the first and second electrodes 146 and 156 directly contacting each other is electrically insulated due to the oxide pattern 160, an electrical shortage between the first and second electrodes 146 and 156 is prevented even when the first and second electrodes 146 and 156 directly contact each other due to the particle PTL. As a result, increase in power consumption and decrease in display quality due to deterioration such as a dark pixel are prevented.

TABLE 2 below illustrates a sheet resistance of a second electrode of an organic light emitting diode display device according to a first embodiment of the present invention.

TABLE 2

| no. | sheet resistance before aging step($\Omega/\square$) | condition of aging step voltage(V) | time(s) | sheet resistance after aging step ($\Omega/\square$) |
|---|---|---|---|---|
| 1 | 30 | −9 | 30 | 200 |
|  |  |  | 45 | 940K |
|  |  |  | 60 | 40M |
| 2 | 30 | −12 | 30 | 300 |
|  |  |  | 45 | 550K |
|  |  |  | 60 | 10M |
| 3 | 30 | −15 | 30 | 700 |
|  |  |  | 45 | 800K |
|  |  |  | 60 | 1M |

In TABLE 2, while the second electrode 156 including a metal layer of silver has a sheet resistance of about 30$\Omega/\square$ before the aging step, the second electrode 156 including a metal layer of silver has a sheet resistance of about 700$\Omega/\square$ to about 40M$\Omega/\square$ after the aging step. Since the metal layer of silver is changed to oxide layer of silver oxide through the aging step, a sheet resistance of the second electrode 156 increases after the aging step.

Accordingly, even when the first and second electrodes 146 and 156 directly contact each other due to the particle PTL, the first and second electrodes 146 and 156 may be electrically insulated from each other by forming the oxide pattern 160 between the first and second electrodes 146 and 156 through the aging step. In addition, since the aging step is performed under the oxygen ambience or the ozone ambience of high purity, deterioration of the emitting layer 153 due to the external air is prevented.

In the aging step, a magnitude of the reverse bias (i.e., a difference between the high level voltage and the low level voltage) is about 5V to about 20V. For example, the reverse bias of about 9V to about 15V may be applied to the first and second electrodes 146 and 156 for preventing deterioration of the emitting layer 153. In addition, the reverse bias may be applied to the first and second electrodes 146 and 156 for about 30 seconds to about 60 seconds.

The effect of the aging step may depend on the structure of the metal layer of silver. When the metal layer of silver has a grain structure, the oxygen or the ozone may penetrate the metal layer of silver to reach and oxidize the emitting layer. For the purpose of blocking the oxygen or the ozone, the metal layer of silver may have a plate structure. For example, the metal layer of silver may be formed to have the plate structure by depositing silver with a deposition rate of about 1.0 Å/s to about 2.0 Å/s. In addition, the metal layer of silver having the plate structure has a higher transmittance as compared with the metal layer of silver having the grain structure.

Figure 6:
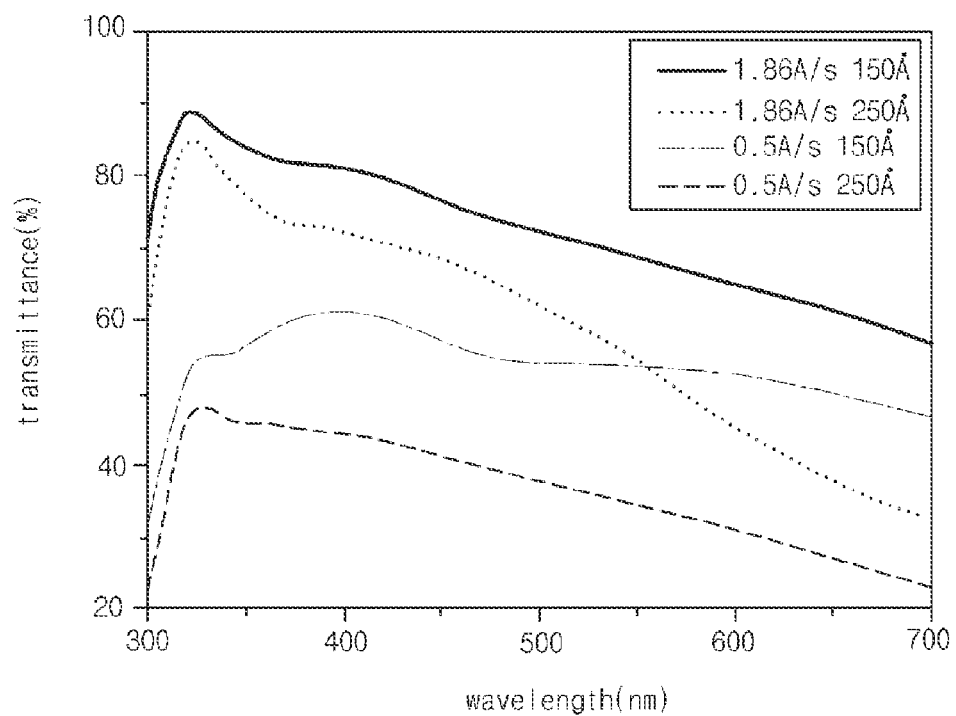
FIG. 6 is a graph showing a transmittance with respect to a wavelength for two thicknesses and two deposition rates of a second electrode of an organic light emitting diode display device according to a first embodiment of the present invention.

FIG. 6 is a graph showing a transmittance with respect to a wavelength for two thicknesses and two deposition rates of a second electrode of an organic light emitting diode display device according to a first embodiment of the present invention.

In FIG. 6, the metal layer of silver formed with a deposition rate of about 1.86 Å/s has a higher transmittance as compared with the metal layer of silver formed with a deposition rate of about 0.5 Å/s. The metal layer of silver having the plate structure obtained by a relatively high deposition rate may block penetration of oxygen or ozone better than the metal layer of silver having the grain structure obtained by a relatively low deposition rate. In addition, since the metal layer of silver having the plate structure has a smaller sheet resistance than the metal layer of silver having the grain structure, the metal layer of silver having the plate structure may be efficiently used for the second electrode 156.

In addition, since the aging step is performed under the oxygen ambience or the ozone ambience of high purity instead of the air, the emitting layer 153 is not exposed to the external air during the aging step. As a result, deterioration of the emitting layer 153 due to the external air is prevented.

FIGS. 7A to 7D are cross-sectional views showing a method of fabricating an organic light emitting diode display device according to a first embodiment of the present invention.

Figure 7A:
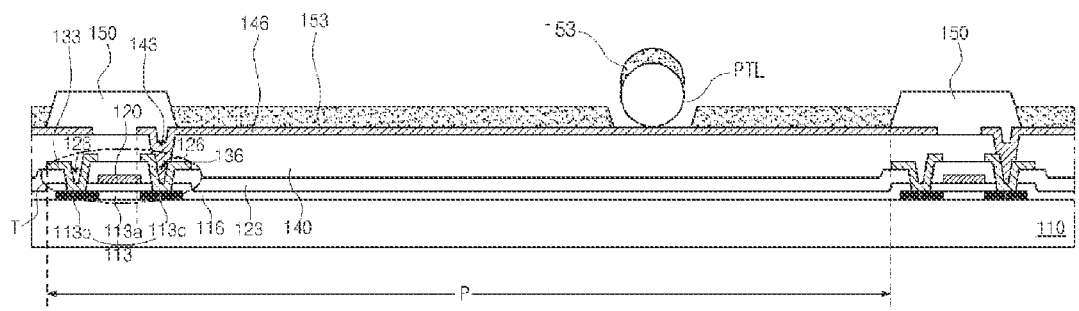
FIGS. 7A to 7D are cross-sectional views showing a method of fabricating an organic light emitting diode display device according to a first embodiment of the present invention.

In FIG. 7A, the gate line GL (of FIG. 2), the data line DL (of FIG. 2) and the power line PL (of FIG. 2) are formed on the first substrate 110, and the switching TFT STr and the driving TFT DTr are formed in the pixel region P. The driving TFT DTr includes the semiconductor layer 113, the gate insulating layer 116, the gate electrode 120, the source electrode 133 and the drain electrode 136.

The semiconductor layer 113 of silicon includes the active region 113a of a channel and the source and drain regions 113b and 113c at both sides of the active region 113a. The gate insulating layer 116 is formed on the semiconductor layer 113, and the gate electrode 120 is formed on the gate insulating layer 116 over the active region 113a of the semiconductor layer 113.

For example, after amorphous silicon layer is formed on the first substrate 110, the amorphous silicon layer may be crystallized by irradiation of a laser or heat treatment to form a polycrystalline silicon layer. The polycrystalline silicon layer may be patterned to form the semiconductor layer 113 of intrinsic polycrystalline silicon. After the gate insulating layer 116 of silicon oxide ($SiO_2$) is formed on the semiconductor layer 113, the gate electrode 120 of one of aluminum (Al), aluminum alloy such as aluminum neodymium (AlNd), copper (Cu) and copper alloy is formed on the gate insulating layer 116. In addition, the active region 113a, the source region 113b and the drain region 113c are formed in the semiconductor layer 113 by doping the semiconductor layer 113 with impurities using the gate electrode 120 as a doping mask.

The interlayer insulating layer 123 is formed on the gate electrode 120, and the source electrode 133 and the drain electrode 136 are formed on the interlayer insulating layer 123. The interlayer insulating layer 123 may include an inorganic insulating material such as silicon oxide ($SiO_2$) and silicon nitride ($SiNx$). The source electrode 133 and the drain electrode 136 may include one of aluminum (Al), aluminum alloy such as aluminum neodymium (AlNd), copper (Cu), copper alloy, chromium (Cr) and molybdenum (Mo).

The passivation layer 140 is formed on the source electrode 133 and the drain electrode 136. The passivation layer may include an organic insulating material such as photo acryl and benzocyclobutene (BCB).

The first electrode 146 connected to the drain electrode 136 of the driving TFT DTr is formed on the passivation layer 140 in the pixel region P. In addition, the bank layer 150 is formed on the first electrode 146 at a boundary portion of the pixel region P.

After the first electrode 146 or the bank layer 150 is formed, the particle PTL from the exterior may be strongly attached to the first electrode 146.

Figure 7B:
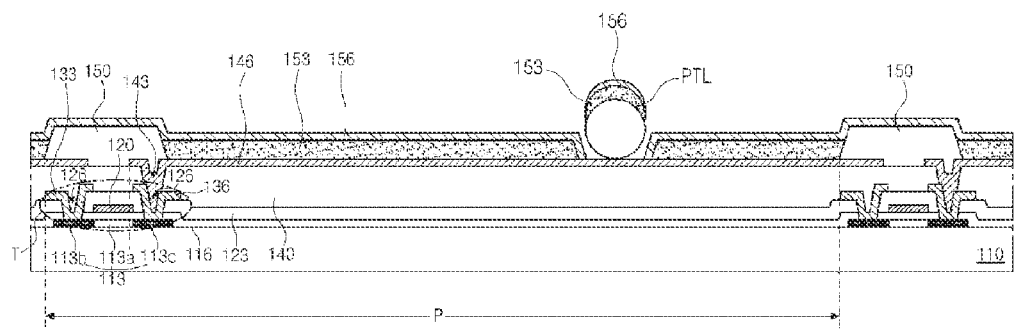

In FIG. 7B, the emitting layer 153 is formed on the first electrode 146 in an open portion of the bank layer 150 by coating or depositing an organic material. The particle PTL may not be removed to remain even after a cleaning step. When the particle PTL remains on the first electrode 146, the emitting layer 153 may be formed on first electrode 146 and the particle PTL such that the emitting layer 153 on the first electrode 146 is separated from the emitting layer 153 on the particle PTL. As a result, the first electrode 146 at a periphery of the particle PTL is exposed through the emitting layer 153.

Next, the second electrode 156 including the metal layer of silver is formed on the emitting layer 153 to complete the light emitting diode E. Here, the second electrode 156 is formed on the emitting layer 153 over the particle PTL, and the second electrode 156 on the emitting layer 153 over the first electrode 146 is separated from the second electrode 156 on the emitting layer 153 over the particle PTL. In addition, the second electrode 156 is formed on the first electrode 146 exposed at the periphery of the particle PTL such that the second electrode 156 directly contacts the first electrode 146.

When the first and second electrodes 146 and 156 directly contact each other, the first and second electrodes 146 and 156 are electrically connected and a current from a driving TFT DTr does not flow through the emitting layer 153. Since the current directly flows from the first electrode 146 to the second electrode 156, a light is not emitted from the emitting layer 153 and the pixel region P having the particle PTL becomes a dark pixel displaying a black color. As a result, a power consumption increases and a display quality is deteriorated.

Figure 7C:
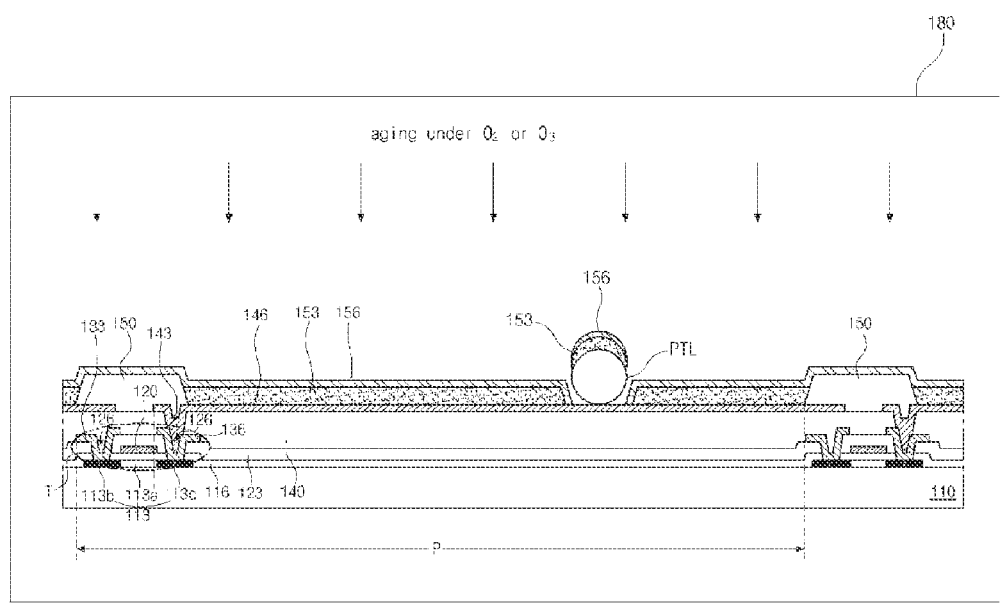

In FIG. 7C, the first substrate 110 having the light emitting diode E is loaded in an aging chamber 180 and the aging step is performed for the first substrate 110. During the aging step, the aging chamber 180 is filled with an oxygen ($O_2$) gas or an ozone ($O_3$) of high purity, and the reverse bias is applied to the first and second electrodes 146 and 156. For example, a low level voltage may be applied to the first electrode 146 of an anode, and a high level voltage may be applied to the second electrode 156 of a cathode. The magnitude of the reverse bias (i.e., a difference between the high level voltage and the low level voltage) may be about 5V to about 20V. For preventing deterioration of the emitting layer 153, the reverse bias of about 9V to about 15V may be applied to the first and second electrodes 146 and 156. In addition, the reverse bias may be applied to the first and second electrodes 146 and 156 for about 30 seconds to about 60 seconds.

A heat is generated at a contact portion of the first and second electrodes 146 and 156 by the reverse bias of the aging step, and the contact portion of the first and second electrodes 146 and 156 is oxidized to form the oxide pattern 160 of silver oxide. As a result, the first and second electrodes 146 and 156 are electrically insulated due to the oxide pattern 160.

Figure 7D:
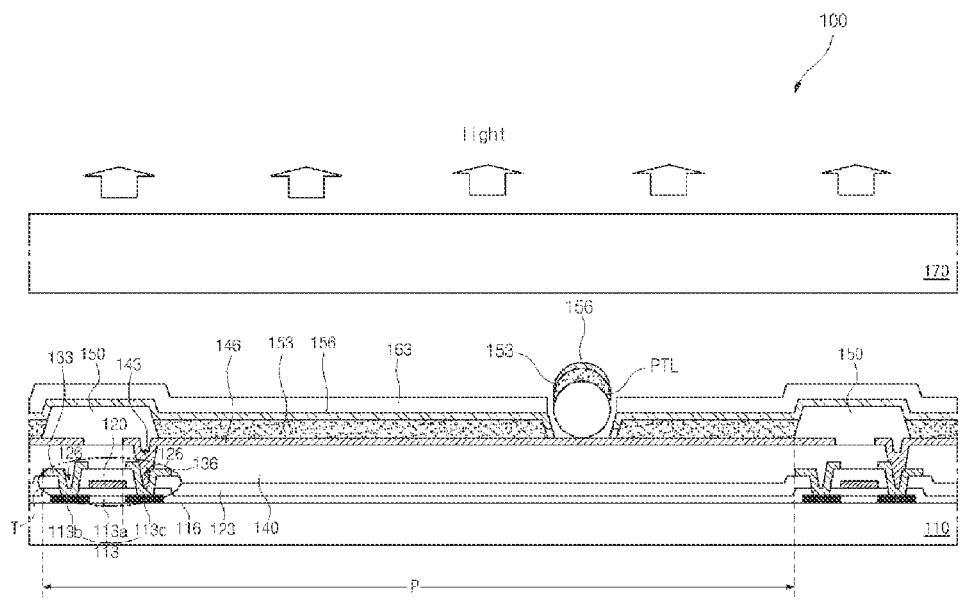

In FIG. 7D, the capping layer 163 is formed on the second electrode 156, and the second substrate 170 is attached to the first substrate 110 using the seal pattern of an edge region or the seal layer of an entire region. The seal or the seal layer may include an inorganic material, an organic material or a multiple layer of an inorganic material and an organic material.

In the OLED display device 100 of a top emission type according to the first embodiment of the present disclosure, the second electrode 156 includes the metal layer of silver having a thickness of about 150 Å to about 250 Å to have a relatively low sheet resistance and a relatively high transmittance. Since the transmission of the second electrode 156 is maximized and the voltage drop of the second electrode 156 is minimized, emission efficiency and uniformity in brightness of the OLED display device 100 are improved.

In addition, even when the first and second electrodes 146 and 156 directly contact each other due to the particle PTL, an electrical shortage between the first and second electrodes 146 and 156 is prevented due to the oxide pattern 160 generated by the subsequent aging step where the reverse bias is applied to the first and second electrodes 146 and 156 under the oxygen ambience or the ozone ambience. Accordingly, increase in power consumption and decrease in display quality due to deterioration such as a dark pixel are prevented.

Figure 8:
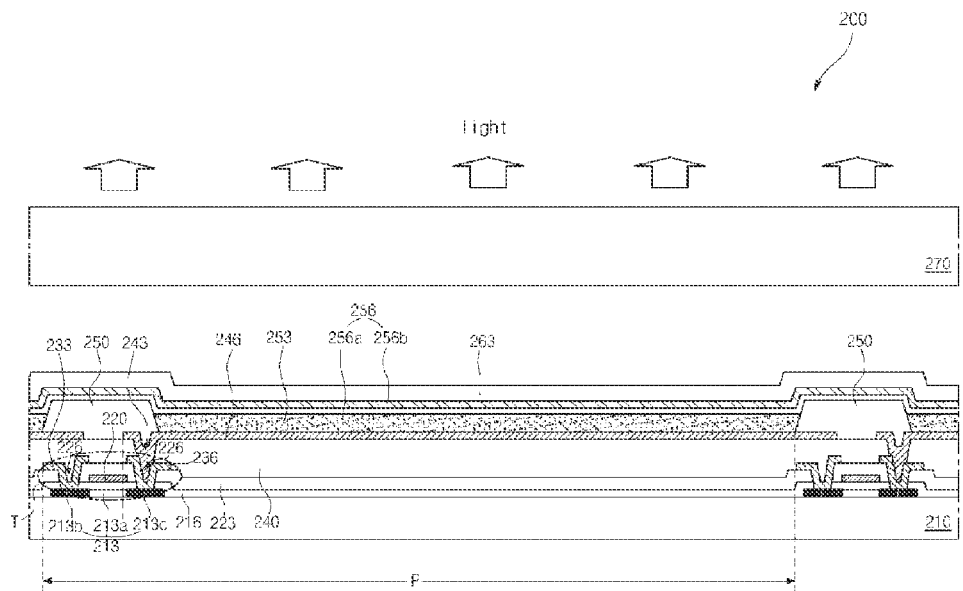
FIG. 8 is a cross-sectional view showing an organic light emitting diode display device according to a second embodiment of the present invention.

FIG. 8 is a cross-sectional view showing an organic light emitting diode display device according to a second embodiment of the present invention.

In FIG. 8, an organic light emitting diode (OLED) display device 200 of a top emission type includes a first substrate 210 and a second substrate 270 for encapsulation, and a switching thin film transistor (TFT), a driving TFT DTr and a light emitting diode E are formed on an inner surface of the first substrate 210. The second substrate 270 may be omitted in another embodiment by forming an inorganic insulating layer or an organic insulating layer on a top surface of the first substrate 210. The first substrate 210 may be referred to as an array substrate and the second substrate 270 may be referred to as an encapsulation substrate.

A semiconductor layer 213 including an active region 213a at a central portion thereof and a source region 213b and a drain region 213c at both sides of the active region 213a is formed on the first substrate 210. The active region 213a may be formed of an intrinsic polycrystalline silicon to function as a channel, and the source region 213b and the drain region 213c may be formed of an impurity-doped polycrystalline silicon to function as a source and a drain. Although not shown, a buffer layer of an inorganic insulating material such as silicon oxide ($SiO_2$) and silicon nitride (SiNx) may be formed between the first substrate 210 and the semiconductor layer 213. The buffer layer may be formed between the first substrate 210 and the semiconductor layer 213 to prevent deterioration of the semiconductor layer 213 due to alkali ions erupting from the first substrate 210 during a crystallization process for the semiconductor layer 213.

A gate insulating layer 216 is formed on the semiconductor layer 213, and a gate electrode 220 is formed on the gate insulating layer 216 over the active region 213a of the semiconductor layer 213. In addition, a gate line connected to a gate electrode of the switching TFT is formed on the gate insulating layer 216.

An interlayer insulating layer 223 of an inorganic insulating material such as silicon oxide ($SiO_2$) and silicon nitride (SiNx) is formed on the gate electrode 220 and the gate line. The interlayer insulating layer 223 and the gate insulating layer 216 have semiconductor contact holes 226 exposing the source region 213b and the drain region 213c of the semiconductor layer 213.

A data line and a power line crossing the gate line are formed on the interlayer insulating layer 223. In addition, a source electrode 233 and a drain electrode 236 spaced apart from each other are formed on the interlayer insulating layer 223. The source electrode 233 and the drain electrode 236 are connected to the source region 213b and the drain region 213c, respectively, of the semiconductor layer 213 through the semiconductor contact holes 226.

The semiconductor layer 213, the gate insulating layer 216, the gate electrode 220, the interlayer insulating layer 223, the source electrode 233 and the drain electrode 236 constitute the driving TFT DTr. The switching TFT may have the same structure as the driving TFT DTr. The switching TFT is connected to the gate line, the data line and the driving TFT DTr.

Although the switching TFT and the driving TFT DTr have a top gate type including the semiconductor layer 213 of polycrystalline silicon in the second embodiment, the switching TFT and the driving TFT DTr may have a bottom gate type including a semiconductor layer of amorphous silicon or an oxide semiconductor material in another embodiment.

A passivation layer 240 is formed on the switching TFT and the driving TFT DTr. The passivation layer 240 includes a drain contact hole 243 exposing the drain electrode 236 of the driving TFT DTr. The passivation layer 240 may be formed of an organic insulating material such as photo acryl to have a flat top surface. In another embodiment, an additional passivation layer of an inorganic insulating material may be formed between the switching TFT and the driving TFT DTr and the passivation layer 240, and the passivation layer 240 and the additional passivation layer may include the drain contact hole 243.

A first electrode 246 is formed on the passivation layer 240 in the pixel region P. The first electrode 246 is connected to the drain electrode 236 of the driving TFT DTr through the drain contact hole 243. The first electrode 246 may be formed of a material having a relatively high work function to function as an anode supplying a hole to the emitting layer 253. For example, the first electrode 246 may be formed of a transparent conductive material such as indium-tin-oxide (ITO) and indium-zinc-oxide (IZO).

Although the first electrode 246 has a single-layered structure in the second embodiment, the first electrode 246 may have a multiple-layered structure in another embodiment. For example, an uppermost layer of the first electrode 246 may be formed of a transparent conductive material, and one of the other layers of the first electrode 246 may be formed of a metallic material having a relatively high reflectance.

A bank layer 250 is formed on the first electrode 246 at a boundary portion of the pixel region P. The bank layer 250 covers an edge portion of the first electrode 246 and exposes a central portion of the first electrode 246 to form an open portion. The bank layer 250 may have a single-layered structure including a hydrophobic material or may have a double-layered structure of a first layer including a hydrophilic material and a second layer including a hydrophobic material.

An emitting layer 253 is formed on the first electrode 246 exposed through the open portion of the bank layer 250. The emitting layer 253 may emit one of red, green and blue colored lights in the pixel region P. Although not shown, the emitting layer 253 may include a hole injecting layer (HIL), a hole transporting layer (HTL), an emitting material layer (EML), an electron transporting layer (ETL) and an electron injecting layer (EIL). The hole injecting layer and the electron injecting layer reduce barriers of a hole injecting energy and an electron injecting energy so that a hole and an electron can be effectively transmitted to the emitting material layer and a driving voltage can be reduced.

A second electrode 256 is formed on the emitting layer 253. The second electrode 256 may include an alloy layer 256a and a metal layer 256b to have a relatively low work function to function as a cathode supplying an electron to the emitting layer 253. The second electrode 256 may be formed on an entire surface of the first substrate 210. For example, the alloy layer 256a may include one of magnesium silver (MgAg) alloy and cesium silver (CsAg) alloy, and the metal layer 256b may include silver (Ag).

The thickness of the metal layer 256b may be greater than the thickness of the alloy layer 256a to prevent oxidation of the alloy layer 256a. The alloy layer 256a may have a thickness of about 2 Å to about 200 Å, preferably about 2 Å to about 50 Å. When the alloy layer 256a has a thickness smaller than about 2 Å, the alloy layer 256a has a non-uniform thickness. When the alloy layer 256a has a thickness greater than about 200 Å, the alloy layer 256a has a relatively low transmittance. The metal layer 256b may have a thickness of about 50 Å to about 300 Å, preferably about 50 Å to about 200 Å. When the metal layer 256b has a thickness smaller than about 50 Å, the electron is hardly injected into the emitting layer 253 by a relatively low voltage. When the metal layer 256b has a thickness greater than about 300 Å, the metal layer 256b has a relatively low transmittance.

The first electrode 246, the emitting layer 253 and the second electrode 256 constitute a light emitting diode E.

A capping layer 263 is formed on the second electrode 256 of the light emitting diode E. The capping layer 263 may be formed of a material having a refractive index greater than about 1.5 to maximize a surface plasmon effect and a complex refractive index. For example, the capping layer 263 may be formed of one of an inorganic material, an organic material and a metal oxide. The capping layer 263 covers the light emitting diode E to prevent penetration of moist to the emitting layer 253. In addition, the capping layer 263 may minimize reflectance of external light at the second electrode 256 and may maximize transmittance through the second electrode 256. The capping layer 263 may be omitted in another embodiment.

The second substrate 270 is attached to the first substrate 210 using a seal pattern of an edge region or a seal layer of an entire region. The seal pattern or the seal layer may cover and protect the driving TFT DTr and the light emitting diode E. For example, the seal pattern or the seal layer may include a light curable resin or a heat curable resin.

The first substrate 210 may be formed of one of glass, plastic, stainless steel and metal foil, and the second substrate 270 may be formed of glass. A space between the first and second substrates 210 and 270 may be filled with one of air, nitrogen gas and adhesive.

In the OLED display device 200 of a top emission type, since the second electrode 256 includes the alloy layer 256a of one of magnesium silver (MgAg) alloy and cesium silver (CsAg) alloy and the metal layer 256b of silver, the second electrode 256 has a relatively low resistance and a relatively high transmittance together even for a large-sized panel.

Figure 9:
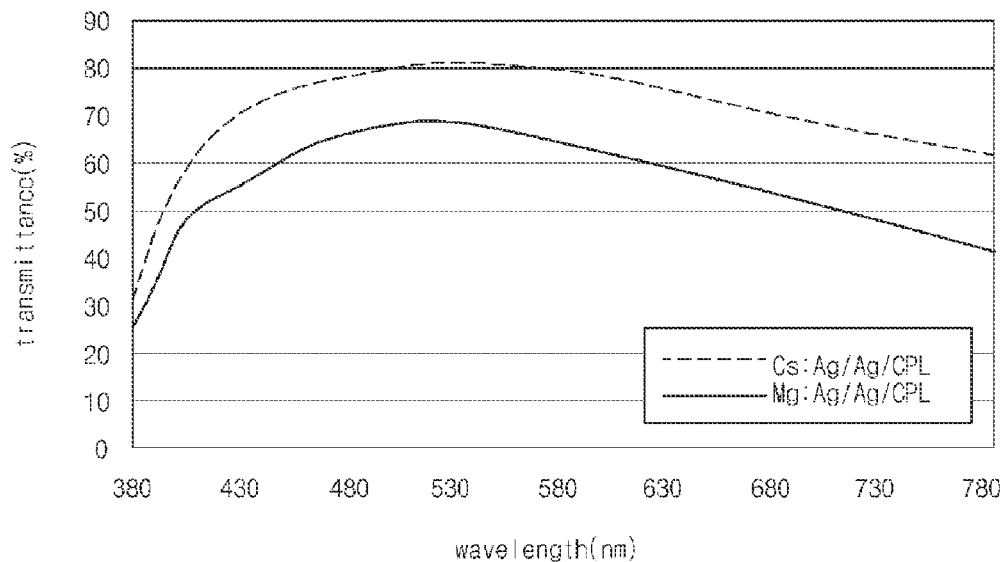
FIG. 9 is a graph showing a transmittance with respect to a wavelength for two materials of an alloy layer of a second electrode of an organic light emitting diode display device according to a second embodiment of the present invention.

FIG. 9 is a graph showing a transmittance with respect to a wavelength for two materials of an alloy layer of a second electrode of an organic light emitting diode display device according to a second embodiment of the present invention.

In FIG. 9, the second electrode 256 includes the alloy layer 256a of one of magnesium silver (MgAg) alloy and cesium silver (CsAg) alloy and the metal layer 256b of silver. In addition, the capping layer 263 is formed on the metal layer 256b. The ally layer 256a of magnesium silver (MgAg) alloy, the metal layer 256b of silver and the capping layer 263 have a transmittance of about 68.4% at a wavelength of about 550 nm, and the ally layer 256a of cesium silver (CsAg) alloy, the metal layer 256b of silver and the capping layer 263 have a transmittance of about 81.0% at a wavelength of about 550 nm. Accordingly, a transmittance of the OLED display device 200 is improved by using the alloy layer 256a of one of magnesium silver (MgAg) alloy and cesium silver (CsAg) alloy and the metal layer 256b of silver as the second electrode 256.

In the OLED display device 200 of a top emission type, when the first and second electrodes 246 and 256 directly contact each other due to a particle PTL (of FIG. 11A), an electrical shortage between the first and second electrodes 246 and 256 is prevented due to a subsequent aging step. Accordingly, increase in power consumption and decrease in display quality due to deterioration such as a dark pixel are prevented.

Figure 10:
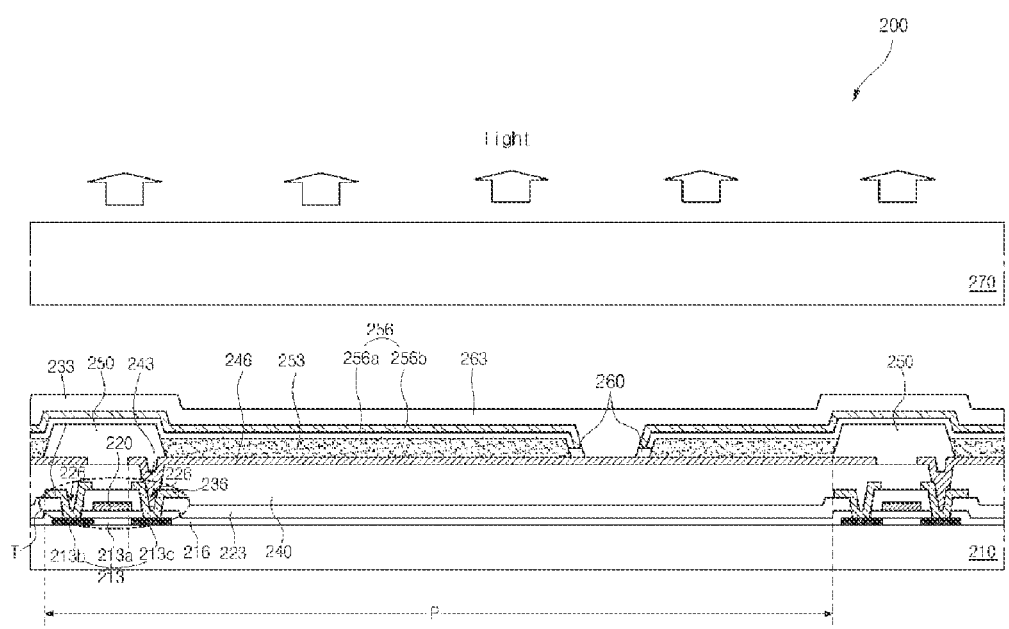
FIG. 10 is a cross-sectional view showing an organic light emitting diode display device having an oxide layer according to a second embodiment of the present invention.

FIG. 10 is a cross-sectional view showing an organic light emitting diode display device having an oxide layer according to a second embodiment of the present invention. FIG. 10 shows an organic light emitting diode (OLED) display device 200 where a particle is removed after an aging step, and illustrations for the same portion as FIG. 8 will be omitted.

In FIG. 10, the driving TFT DTr and the light emitting diode E are formed on the first substrate 210, and the first substrate 210 is encapsulated by the second substrate 270.

The driving TFT DTr includes the semiconductor layer 213, the gate insulating layer 216, the source electrode 233 and the drain electrode 236. The passivation layer 240 is formed on the driving TFT DTr and the light emitting diode E is formed on the passivation layer 240.

The light emitting diode E includes the first electrode 246 of an anode, the emitting layer 253 and the second electrode 256 of a cathode. The first electrode 246 is disposed in the pixel region P and the bank layer 250 is formed at the boundary region of the pixel region P.

After the first electrode 246 and the bank layer 250 are formed, a particle PTL from an exterior may be strongly attached to the first electrode 246. When the particle PTL is not removed through a cleaning step before formation of the emitting layer 253, the emitting layer 253 may be formed on the first electrode 246 and the particle PTL such that the emitting layer 253 on the first electrode is separated from the emitting layer 253 on the particle PTL. As a result, the first electrode 246 at a periphery of the particle PTL is exposed through the emitting layer 253.

Subsequently, when the second electrode 256 is formed on the first substrate 210 having the emitting layer 253, the second electrode 256 may be formed on the emitting layer 253 and on the first electrode 246 exposed due to the particle PTL. As a result, the second electrode 256 directly contacts the first electrode 246 exposed due to the particle PTL.

After the second electrode 256 including the ally layer 256a of silver alloy and the metal layer 256b of silver is formed, an oxide pattern 260 is formed by oxidizing a portion of the second electrode 256 directly contacting the first electrode 246 through an aging step. As a result, an electrical shortage between the first and second electrodes 246 and 256 is prevented. For example, the oxide pattern 260 of silver oxide may be formed between the first and second electrodes 246 and 256 directly contacting each other, and the first and second electrodes 246 and 256 may be electrically insulated. In addition, the oxide pattern 260 may be formed on a side surface of the metal layer 256b adjacent to the first electrode 246 and may be formed between the second electrode 256 and the particle PTL.

Accordingly, an electrical shortage between the first and second electrodes 246 and 256 is prevented even when the first and second electrodes 246 and 256 directly contact each other due to the particle PTL. In addition, increase in power consumption and decrease in display quality due to deterioration such as a dark pixel are prevented.

In the aging step, a reverse bias is applied to the first and second electrodes 246 and 256 under an oxygen ($O_2$) ambience or an ozone ($O_3$) ambience. For example, a high level voltage and a low level voltage may be applied to the second electrode 256 and the first electrode 246, respectively. A portion of the second electrode 256 is oxidized due to a heat generated by the reverse bias to form the oxide pattern 260 of silver oxide. When silver alloy such as magnesium silver (MgAg) alloy and cesium silver (CsAg) alloy is exposed to the oxygen or the ozone, silver alloy is easily oxidized such that the whole portion of silver alloy becomes silver oxide. However, the metal layer 256b of silver which is not easily oxidized covers the alloy layer 256a of silver alloy such that the alloy layer 256a of silver alloy is not exposed to oxygen or ozone. As a result, oxidation of the whole alloy layer 256a of silver alloy is prevented.

In the OLED display device 200 of a top emission type, the second electrode 256 is formed to include the alloy layer 256a of silver alloy and the metal layer 256b of silver, and the reverse bias is applied to the first and second electrodes 246 and 256 under the oxygen ambience or the ozone ambience of high purity when the first and second electrodes 246 and 256 directly contact each other due to the particle PTL. Accordingly, a portion of the second electrode 256 directly contacting the first electrode 246 is oxidized to form the oxide pattern 260 of silver oxide. Since the portion where the first and second electrodes 246 and 256 directly contacting each other is electrically insulated due to the oxide pattern 260, an electrical shortage between the first and second electrodes 246 and 256 is prevented even when the first and second electrodes 246 and 256 directly contact each other due to the particle PTL. As a result, increase in power consumption and decrease in display quality due to deterioration such as a dark pixel are prevented.

FIGS. 11A to 11D are cross-sectional views showing a method of fabricating an organic light emitting diode display device according to a second embodiment of the present invention.

Figure 11A:
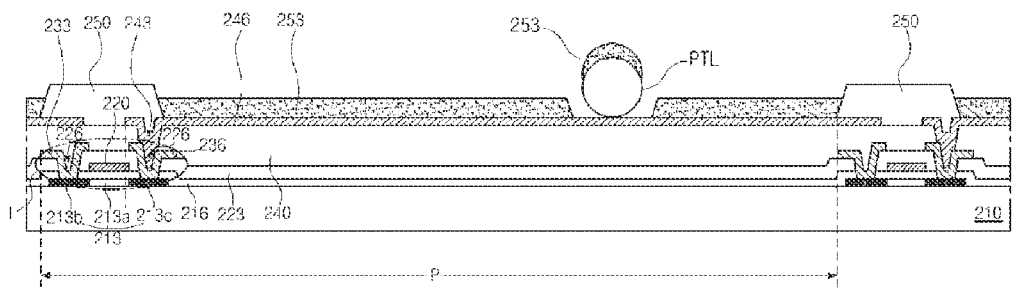
FIGS. 11A to 11D are cross-sectional views showing a method of fabricating an organic light emitting diode display device according to a second embodiment of the present invention.

In FIG. 11A, the gate line, the data line and the power line are formed on the first substrate 210, and the switching TFT and the driving TFT DTr are formed in the pixel region P. The driving TFT DTr includes the semiconductor layer 213, the gate insulating layer 216, the gate electrode 220, the source electrode 233 and the drain electrode 236.

The semiconductor layer 213 of silicon includes the active region 213a of a channel and the source and drain regions 213b and 213c at both sides of the active region 213a. The gate insulating layer 216 is formed on the semiconductor layer 213, and the gate electrode 220 is formed on the gate insulating layer 216 over the active region 213a of the semiconductor layer 213.

For example, after amorphous silicon layer is formed on the first substrate 210, the amorphous silicon layer may be crystallized by irradiation of a laser or heat treatment to form a polycrystalline silicon layer. The polycrystalline silicon layer may be patterned to form the semiconductor layer 213 of intrinsic polycrystalline silicon. After the gate insulating layer 216 of silicon oxide ($SiO_2$) is formed on the semiconductor layer 213, the gate electrode 220 of one of aluminum (Al), aluminum alloy such as aluminum neodymium (AlNd), copper (Cu) and copper alloy is formed on the gate insulating layer 216. In addition, the active region 213a, the source region 213b and the drain region 213c are formed in the semiconductor layer 213 by doping the semiconductor layer 213 with impurities using the gate electrode 220 as a doping mask.

The interlayer insulating layer 223 is formed on the gate electrode 220, and the source electrode 233 and the drain electrode 236 are formed on the interlayer insulating layer 223. The interlayer insulating layer 223 may include an inorganic insulating material such as silicon oxide ($SiO_2$) and silicon nitride (SiNx). The source electrode 233 and the drain electrode 236 may include one of aluminum (Al), aluminum alloy such as aluminum neodymium (AlNd), copper (Cu), copper alloy, chromium (Cr) and molybdenum (Mo).

The passivation layer 240 is formed on the source electrode 233 and the drain electrode 236. The passivation layer may include an organic insulating material such as photo acryl and benzocyclobutene (BCB).

The first electrode 246 connected to the drain electrode 236 of the driving TFT DTr is formed on the passivation layer 240 in the pixel region P. In addition, the bank layer 250 is formed on the first electrode 246 at a boundary portion of the pixel region P.

After the first electrode 246 or the bank layer 250 is formed, the particle PTL from the exterior may be strongly attached to the first electrode 246.

Figure 11B:
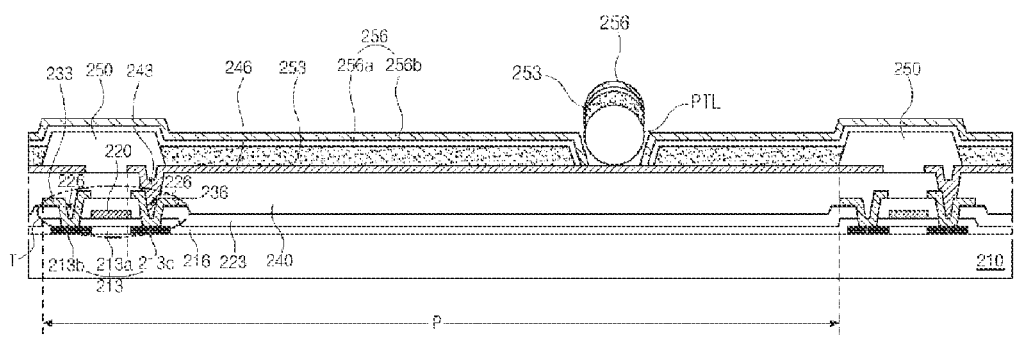

In FIG. 11B, the emitting layer 253 is formed on the first electrode 246 in an open portion of the bank layer 250 by coating or depositing an organic material. The particle PTL may not be removed to remain even after a cleaning step.

When the particle PTL remains on the first electrode 246, the emitting layer 253 may be formed on first electrode 246 and the particle PTL such that the emitting layer 253 on the first electrode 246 is separated from the emitting layer 253 on the particle PTL. As a result, the first electrode 246 at a periphery of the particle PTL is exposed through the emitting layer 253.

Next, the second electrode 256 including the alloy layer 256a of silver alloy and the metal layer 256b of silver is formed on the emitting layer 253 to complete the light emitting diode E. Here, the second electrode 256 is formed on the emitting layer 253 over the particle PTL, and the second electrode 256 on the emitting layer 253 over the first electrode 246 is separated from the second electrode 256 on the emitting layer 253 over the particle PTL. In addition, the second electrode 256 is formed on the first electrode 246 exposed at the periphery of the particle PTL such that the second electrode 256 directly contacts the first electrode 246.

When the first and second electrodes 246 and 256 directly contact each other, the first and second electrodes 246 and 256 are electrically connected and a current from a driving TFT DTr does not flow through the emitting layer 253. Since the current directly flows from the first electrode 246 to the second electrode 256, a light is not emitted from the emitting layer 253 and the pixel region P having the particle PTL becomes a dark pixel displaying a black color. As a result, a power consumption increases and a display quality is deteriorated.

Figure 11C:
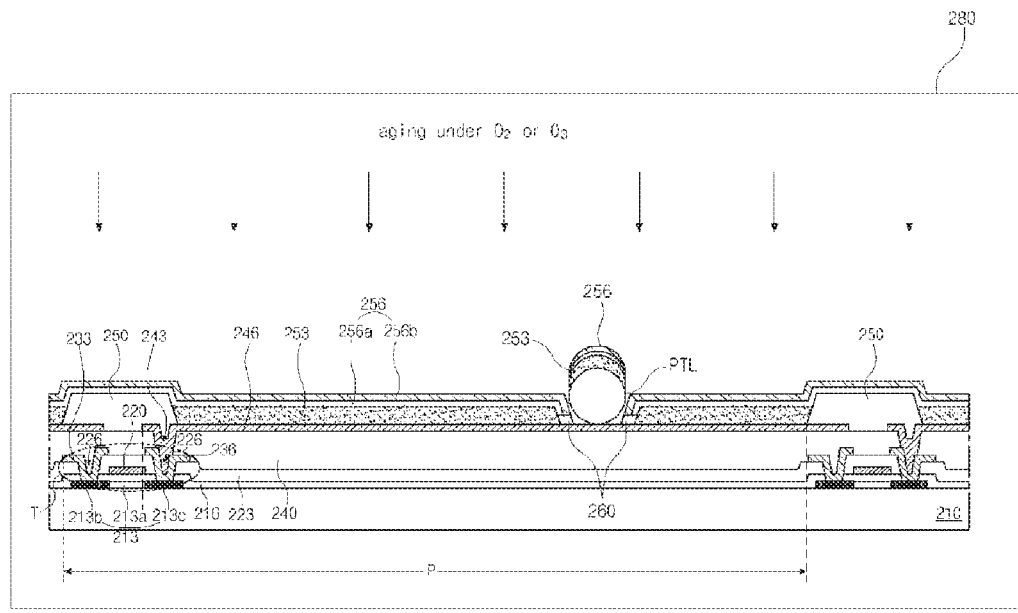

In FIG. 11C, the first substrate 210 having the light emitting diode E is loaded in an aging chamber 280 and the aging step is performed for the first substrate 210. During the aging step, the aging chamber 280 is filled with an oxygen ($O_2$) gas or an ozone ($O_3$) gas of high purity, and the reverse bias is applied to the first and second electrodes 246 and 256. For example, a low level voltage may be applied to the first electrode 246 of an anode, and a high level voltage may be applied to the second electrode 256 of a cathode. The magnitude of the reverse bias (i.e., a difference between the high level voltage and the low level voltage) may be about 5V to about 20V. For preventing deterioration of the emitting layer 253, the reverse bias of about 9V to about 15V may be applied to the first and second electrodes 246 and 256. In addition, the reverse bias may be applied to the first and second electrodes 246 and 256 for about 30 seconds to about 60 seconds.

A heat is generated at a contact portion of the first and second electrodes 246 and 256 by the reverse bias of the aging step, and the contact portion of the first and second electrodes 246 and 256 is oxidized to form the oxide pattern 260 of silver oxide. As a result, the first and second electrodes 246 and 256 are electrically insulated due to the oxide pattern 260. Although silver alloy such as magnesium silver (MgAg) alloy and cesium silver (CsAg) alloy is easily oxidized, oxidation of the whole alloy layer 256a of silver alloy is prevented because the alloy layer 256a of silver alloy is covered with the metal layer 256b of silver.

Figure 11D:
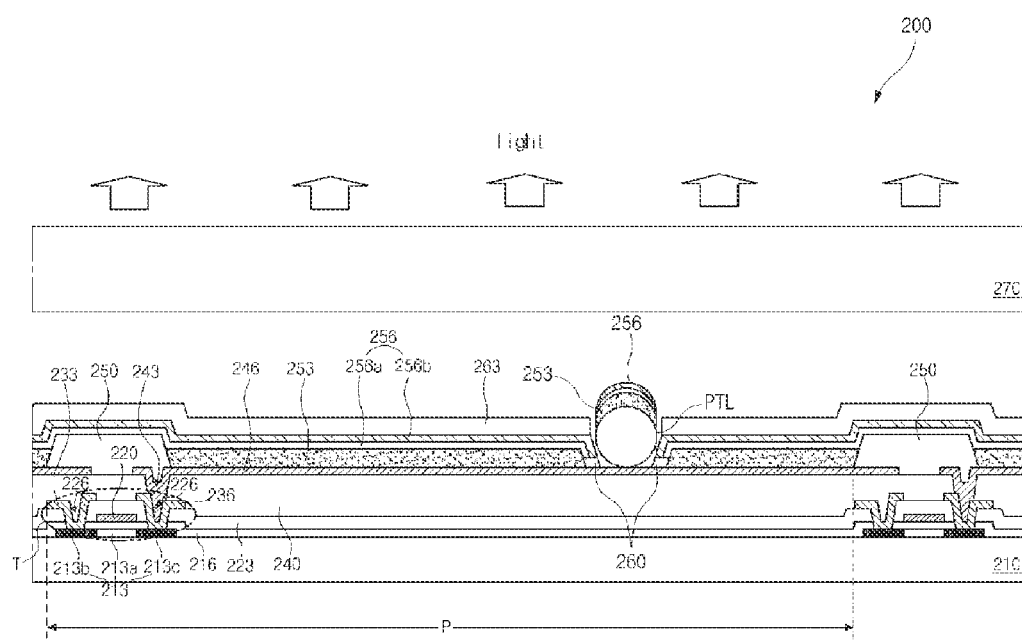

In FIG. 11D, the capping layer 263 is formed on the second electrode 256, and the second substrate 270 is attached to the first substrate 210 using the seal pattern of an edge region or the seal layer of an entire region. The seal or the seal layer may include an inorganic material, an organic material or a multiple layer of an inorganic material and an organic material.

In the OLED display device 200 of a top emission type according to the second embodiment of the present invention, the second electrode 256 includes the alloy layer 256a of silver alloy and the metal layer 256b of silver to have a relatively low sheet resistance and a relatively high transmittance. Since the transmission of the second electrode 256 is maximized and the voltage drop of the second electrode 256 is minimized, emission efficiency and uniformity in brightness of the OLED display device 200 are improved.

In addition, even when the first and second electrodes 246 and 256 directly contact each other due to the particle PTL, an electrical shortage between the first and second electrodes 246 and 256 is prevented due to the oxide pattern 260 generated by the subsequent aging step where the reverse bias is applied to the first and second electrodes 246 and 256 under the oxygen ambience or the ozone ambience. Accordingly, increase in power consumption and decrease in display quality due to deterioration such as a dark pixel are prevented. Further, since the alloy layer 256a of silver alloy is covered with the metal layer 256b of silver, oxidation of the whole alloy layer 256a of silver alloy is prevented.

Figure 12:
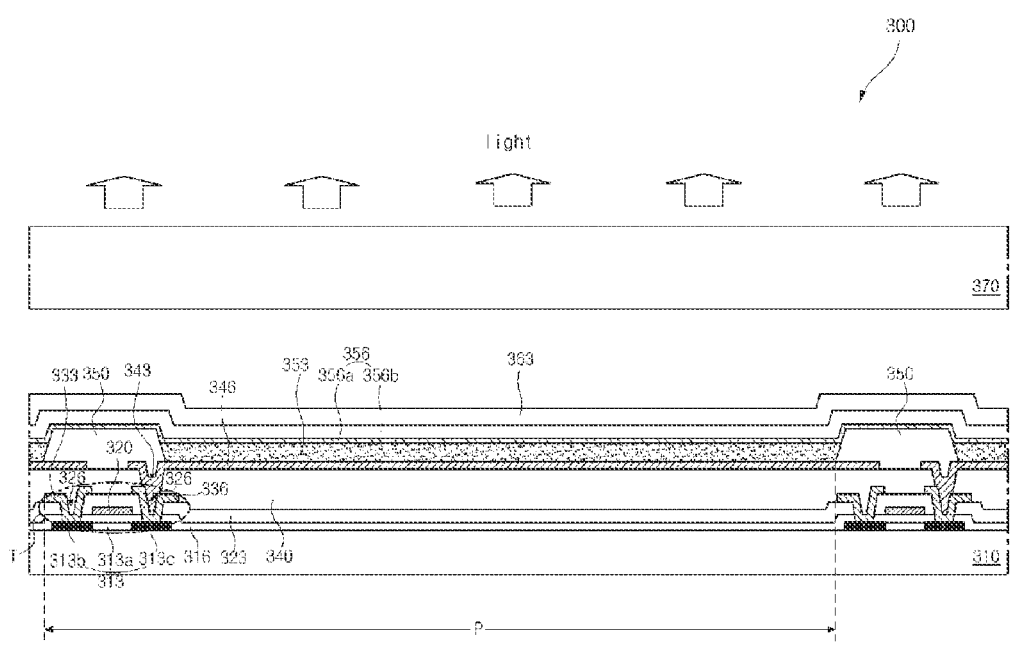
FIG. 12 is a cross-sectional view showing an organic light emitting diode display device according to a third embodiment of the present invention.

FIG. 12 is a cross-sectional view showing an organic light emitting diode display device according to a third embodiment of the present invention.

In FIG. 12, an organic light emitting diode (OLED) display device 300 of a top emission type includes a first substrate 310 and a second substrate 370 for encapsulation, and a switching thin film transistor (TFT), a driving TFT DTr and a light emitting diode E are formed on an inner surface of the first substrate 310. The second substrate 370 may be omitted in another embodiment by forming an inorganic insulating layer or an organic insulating layer on a top surface of the first substrate 310. The first substrate 310 may be referred to as an array substrate and the second substrate 370 may be referred to as an encapsulation substrate.

A semiconductor layer 313 including an active region 313a at a central portion thereof and a source region 313b and a drain region 313c at both sides of the active region 313a is formed on the first substrate 310. The active region 313a may be formed of an intrinsic polycrystalline silicon to function as a channel, and the source region 313b and the drain region 313c may be formed of an impurity-doped polycrystalline silicon to function as a source and a drain. Although not shown, a buffer layer of an inorganic insulating material such as silicon oxide ($SiO_2$) and silicon nitride (SiNx) may be formed between the first substrate 310 and the semiconductor layer 313. The buffer layer may be formed between the first substrate 310 and the semiconductor layer 313 to prevent deterioration of the semiconductor layer 313 due to alkali ions erupting from the first substrate 310 during a crystallization process for the semiconductor layer 313.

A gate insulating layer 316 is formed on the semiconductor layer 313, and a gate electrode 320 is formed on the gate insulating layer 316 over the active region 313a of the semiconductor layer 313. In addition, a gate line connected to a gate electrode of the switching TFT is formed on the gate insulating layer 316.

An interlayer insulating layer 323 of an inorganic insulating material such as silicon oxide ($SiO_2$) and silicon nitride (SiNx) is formed on the gate electrode 320 and the gate line. The interlayer insulating layer 323 and the gate insulating layer 316 have semiconductor contact holes 326 exposing the source region 313b and the drain region 313c of the semiconductor layer 313.

A data line and a power line crossing the gate line are formed on the interlayer insulating layer 323. In addition, a source electrode 333 and a drain electrode 336 spaced apart from each other are formed on the interlayer insulating layer 323. The source electrode 333 and the drain electrode 336 are connected to the source region 313b and the drain region 313c, respectively, of the semiconductor layer 313 through the semiconductor contact holes 326.

The semiconductor layer 313, the gate insulating layer 316, the gate electrode 320, the interlayer insulating layer 323, the source electrode 333 and the drain electrode 336 constitute the driving TFT DTr. The switching TFT may have the same structure as the driving TFT DTr. The switching TFT is connected to the gate line, the data line and the driving TFT DTr.

Although the switching TFT and the driving TFT DTr have a top gate type including the semiconductor layer 313 of polycrystalline silicon in the third embodiment, the switching TFT and the driving TFT DTr may have a bottom gate type including a semiconductor layer of amorphous silicon or an oxide semiconductor material in another embodiment.

The switching TFT and the driving TFT of a bottom gate type may include a gate electrode, a gate insulating layer on the gate electrode, a semiconductor layer having an active layer of intrinsic amorphous silicon and an ohmic contact layer of impurity-doped amorphous silicon on the gate insulating layer over the gate electrode, and source and drain electrodes on the ohmic contact layer. Alternatively, the switching TFT and the driving TFT of a bottom gate type may include a gate electrode, a gate insulating layer on the gate electrode, a semiconductor layer of an oxide semiconductor layer on the gate insulating layer over the gate electrode, an etch stopper on the semiconductor layer, and source and drain electrodes on the etch stopper.

In the first substrate having the switching TFT and the driving TFT of a bottom gate type, the gate line may have the same layer as the gate electrode to be connected to the gate electrode of the switching TFT, and the data line may have the same layer as the source electrode and the drain electrode to be connected to the source electrode of the switching TFT.

A passivation layer 340 is formed on the switching TFT and the driving TFT DTr. The passivation layer 340 includes a drain contact hole 343 exposing the drain electrode 336 of the driving TFT DTr. The passivation layer 340 may be formed of an organic insulating material such as photo acryl to have a flat top surface. In another embodiment, an additional passivation layer of an inorganic insulating material may be formed between the switching TFT and the driving TFT DTr and the passivation layer 340, and the passivation layer 340 and the additional passivation layer may include the drain contact hole 343.

A first electrode 346 is formed on the passivation layer 340 in the pixel region P. The first electrode 346 is connected to the drain electrode 336 of the driving TFT DTr through the drain contact hole 343. The first electrode 346 may be formed of a material having a relatively high work function to function as an anode supplying a hole to the emitting layer 353. For example, the first electrode 346 may be formed of a transparent conductive material such as indium-tin-oxide (ITO) and indium-zinc-oxide (IZO).

Although the first electrode 346 has a single-layered structure in the third embodiment, the first electrode 346 may have a multiple-layered structure in another embodiment. For example, an uppermost layer of the first electrode 346 may be formed of a transparent conductive material, and one of the other layers of the first electrode 346 may be formed of a metallic material having a relatively high reflectance.

A bank layer 350 is formed on the first electrode 346 at a boundary portion of the pixel region P. The bank layer 350 covers an edge portion of the first electrode 346 and exposes a central portion of the first electrode 346 to form an open portion. The bank layer 350 may have a single-layered structure including a hydrophobic material or may have a double-layered structure of a first layer including a hydrophilic material and a second layer including a hydrophobic material.

An emitting layer 353 is formed on the first electrode 346 exposed through the open portion of the bank layer 350. The emitting layer 353 may emit one of red, green and blue colored lights in the pixel region P. Although not shown, the emitting layer 353 may include a hole injecting layer (HIL), a hole transporting layer (HTL), an emitting material layer (EML), an electron transporting layer (ETL) and an electron injecting layer (EIL). The hole injecting layer and the electron injecting layer reduce barriers of a hole injecting energy and an electron injecting energy so that a hole and an electron can be effectively transmitted to the emitting material layer and a driving voltage can be reduced.

A second electrode 356 is formed on the emitting layer 353. The second electrode 356 may include a metal layer 356a and an oxide layer 356b to have a relatively low work function to function as a cathode supplying an electron to the emitting layer 353. The second electrode 356 may be formed on an entire surface of the first substrate 310. For example, the metal layer 356a may include silver (Ag) or silver alloy, and the oxide layer 356b may include silver oxide. In addition, the second electrode 356 may have a sheet resistance of about 1Ω/□ to about 7Ω/□ and a transmittance greater than about 45%.

The first electrode 346, the emitting layer 353 and the second electrode 356 constitute a light emitting diode E.

A capping layer 363 is formed on the second electrode 356 of the light emitting diode E. The capping layer 363 may be formed of a material having a refractive index greater than about 1.5 to maximize a surface plasmon effect and a complex refractive index. Further, the capping layer 363 may have a different refractive index from the oxide layer 356b of the second electrode 356. For example, the capping layer 363 may be formed of one of an inorganic material, an organic material and a metal oxide. The capping layer 363 covers the light emitting diode E to prevent penetration of moist to the emitting layer 353. In addition, the capping layer 363 may minimize reflectance of external light at the second electrode 356 and may maximize transmittance through the second electrode 356. The capping layer 363 may be omitted in another embodiment.

The second substrate 370 is attached to the first substrate 310 using a seal pattern of an edge region or a seal layer of an entire region. The seal pattern or the seal layer may cover and protect the driving TFT DTr and the light emitting diode E. For example, the seal pattern or the seal layer may include a light curable resin or a heat curable resin.

The first substrate 310 may be formed of one of glass, plastic, stainless steel and metal foil, and the second substrate 370 may be formed of glass. A space between the first and second substrates 310 and 370 may be filled with one of air, nitrogen gas and adhesive.

In the OLED display device 300 of a top emission type, when a high level voltage and a low level voltage are applied to the first electrode 346 and the second electrode 356, respectively, of the light emitting diode E, the hole from the first electrode 346 and the electron from the second electrode 356 are transmitted to the emitting layer 353 to generate an exciton. When the exciton transitions from an excited state to a ground state, a light is emitted from the emitting layer 353.

The light from the emitting layer 353 passes through the second electrode 356 to display an image. As a result, the second electrode 356 includes a metal layer 356a of silver (Ag) and an oxide layer 356b of silver oxide to have a relatively low sheet resistance and a relatively high transmittance.

For example, the metal layer 356a may include silver or silver alloy such as magnesium silver (MgAg) alloy, aluminum silver (AlAg) alloy, copper silver (CuAg) alloy, magnesium aluminum silver (MgAlAg) alloy, magnesium copper silver (MgCuAg) alloy, aluminum copper silver (AlCuAg) alloy and magnesium aluminum copper silver (MgAlCuAg) alloy. In addition, the oxide layer 356b may include silver oxide. When the metal layer 356a includes silver alloy, the oxide layer 356b may include silver and the other metallic material such as magnesium (Mg), aluminum (Al) and copper (Cu).

A thickness of the oxide layer 356b may be twice to five times of a thickness of the metal layer 356a. For example, the metal layer 356a may have a thickness of about 100 Å to about 200 Å, and the oxide layer 356b may have a thickness of about 200 Å to about 1000 Å.

A transmittance of the second electrode 356 may be determined by a thicknesses ratio of the metal layer 356a and the oxide layer 356b. In addition, the oxide layer 356b may be formed through an oxidation step for a metallic material layer 354 (of FIG. 14B). For example, an oxidation step using an ozone ($O_3$) gas may be performed to a metallic material layer 354, and a thickness of the oxide layer 356b may depend on the oxidation conditions such as a process time, a process temperature and a gas concentration. When the metallic material layer 354 is oxidized under or over a reference oxidation condition, the thickness of the oxide layer 356b may be smaller than twice of the thickness of the metal layer 356a or may be greater than five times of the thickness of the metal layer 356a. As a result, the transmittance of the second electrode 356 may be reduced.

In the OLED display device 300 of a top emission type, since the second electrode 356 has a sheet resistance of about 1Ω/□ to about 7Ω/□, non-uniformity in brightness due to a voltage drop is minimized. In addition, since the second electrode 356 has a transmittance greater than about 45%, display quality is improved.

Figure 13:
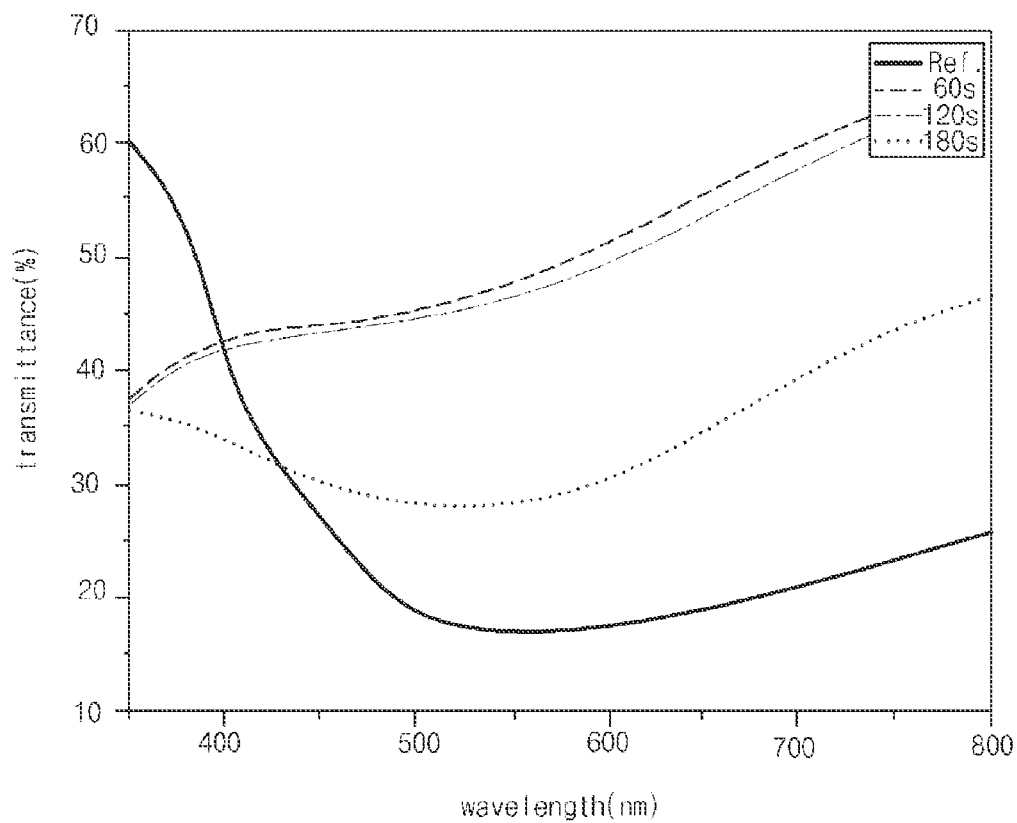
FIG. 13 is a graph showing a transmittance with respect to a wavelength for four oxidation times of a second electrode of an organic light emitting diode display device according to a third embodiment of the present invention.

FIG. 13 is a graph showing a transmittance with respect to a wavelength for four oxidation times of a second electrode of an organic light emitting diode display device according to a third embodiment of the present invention.

In FIG. 13, the metallic material layer of first sample is oxidized for 0 second (i.e., no oxidation; ref.), and the metallic material layers 354 (of FIG. 7B) of second to fourth samples are oxidized for 60 seconds, 120 seconds and 180 seconds, respectively, to form the second electrode 356. The second electrode 356 of the first sample includes a metal layer of silver having a thickness of about 150 Å. The second electrode 356 of the second sample includes a metal layer of silver and an oxide layer of silver oxide having a thickness of about 150 Å, and the second electrode 356 of the third sample includes a metal layer of silver and an oxide layer of silver oxide having a thickness of about 150 Å. The second electrode 356 of the fourth sample includes a metal layer of silver and an oxide layer of silver oxide having a thickness about 150 Å.

The second electrode 356 of the first sample has a transmittance of about 17.5% at a wavelength of about 550 nm. The second electrode 356 of the second sample has a transmittance of about 48.5% (about 2.7 times of the transmittance of the first sample) at a wavelength of about 550 nm, and the second electrode 356 of the third sample has a transmittance of about 47% (about 2.6 times of the transmittance of the first sample) at a wavelength of about 550 nm. The second electrode 356 of the fourth sample has a transmittance of about 29% (about 1.7 times of the transmittance of the first sample) at a wavelength of about 550 nm. Since the metallic material layer of the fourth sample is oxidized for a time greater than a reference oxidation time, the transmittance of the fourth sample is reduced as compared with the transmittance of the second and third samples.

FIGS. 14A to 14D are cross-sectional views showing a method of fabricating an organic light emitting diode display device according to a fourth embodiment of the present invention.

Figure 14A:
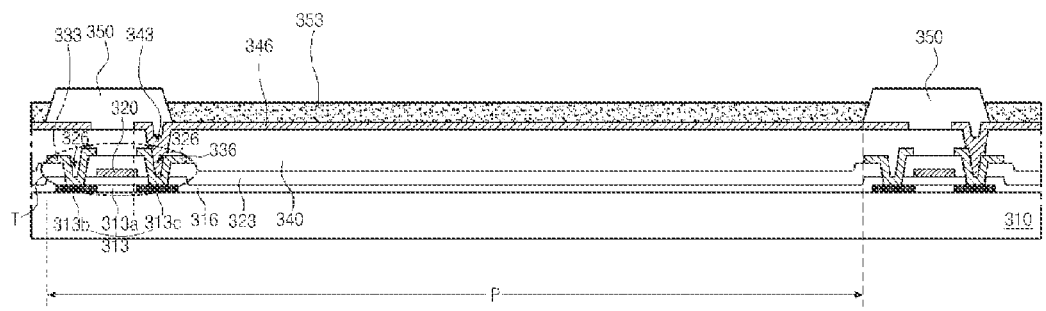
FIGS. 14A to 14D are cross-sectional views showing a method of fabricating an organic light emitting diode display device according to a fourth embodiment of the present invention.

In FIG. 14A, the gate line, the data line and the power line are formed on the first substrate 310, and the switching TFT and the driving TFT DTr are formed in the pixel region P. The driving TFT DTr includes the semiconductor layer 313, the gate insulating layer 316, the gate electrode 320, the source electrode 333 and the drain electrode 336.

The semiconductor layer 313 of silicon includes the active region 313a of a channel and the source and drain regions 313b and 313c at both sides of the active region 313a. The gate insulating layer 316 is formed on the semiconductor layer 313, and the gate electrode 320 is formed on the gate insulating layer 316 over the active region 313a of the semiconductor layer 313.

For example, after amorphous silicon layer is formed on the first substrate 310, the amorphous silicon layer may be crystallized by irradiation of a laser or heat treatment to form a polycrystalline silicon layer. The polycrystalline silicon layer may be patterned to form the semiconductor layer 313 of intrinsic polycrystalline silicon. After the gate insulating layer 316 of silicon oxide ($SiO_2$) is formed on the semiconductor layer 313, the gate electrode 320 of one of aluminum (Al), aluminum alloy such as aluminum neodymium (AlNd), copper (Cu) and copper alloy is formed on the gate insulating layer 316. In addition, the active region 313a, the source region 313b and the drain region 313c are formed in the semiconductor layer 313 by doping the semiconductor layer 313 with impurities using the gate electrode 320 as a doping mask.

The interlayer insulating layer 323 is formed on the gate electrode 320, and the source electrode 333 and the drain electrode 336 are formed on the interlayer insulating layer 323. The interlayer insulating layer 323 may include an inorganic insulating material such as silicon oxide ($SiO_2$) and silicon nitride (SiNx). The source electrode 333 and the drain electrode 236 may include one of aluminum (Al), aluminum alloy such as aluminum neodymium (AlNd), copper (Cu), copper alloy, chromium (Cr) and molybdenum (Mo).

The passivation layer 340 is formed on the source electrode 333 and the drain electrode 336. The passivation layer may include an organic insulating material such as photo acryl and benzocyclobutene (BCB).

The first electrode 346 connected to the drain electrode 336 of the driving TFT DTr is formed on the passivation layer 340 in the pixel region P. In addition, the bank layer 350 is formed on the first electrode 346 at a boundary portion of the pixel region P. the emitting layer 353 is formed on the first electrode 346 in an open portion of the bank layer 350 by coating or depositing an organic material.

Figure 14B:
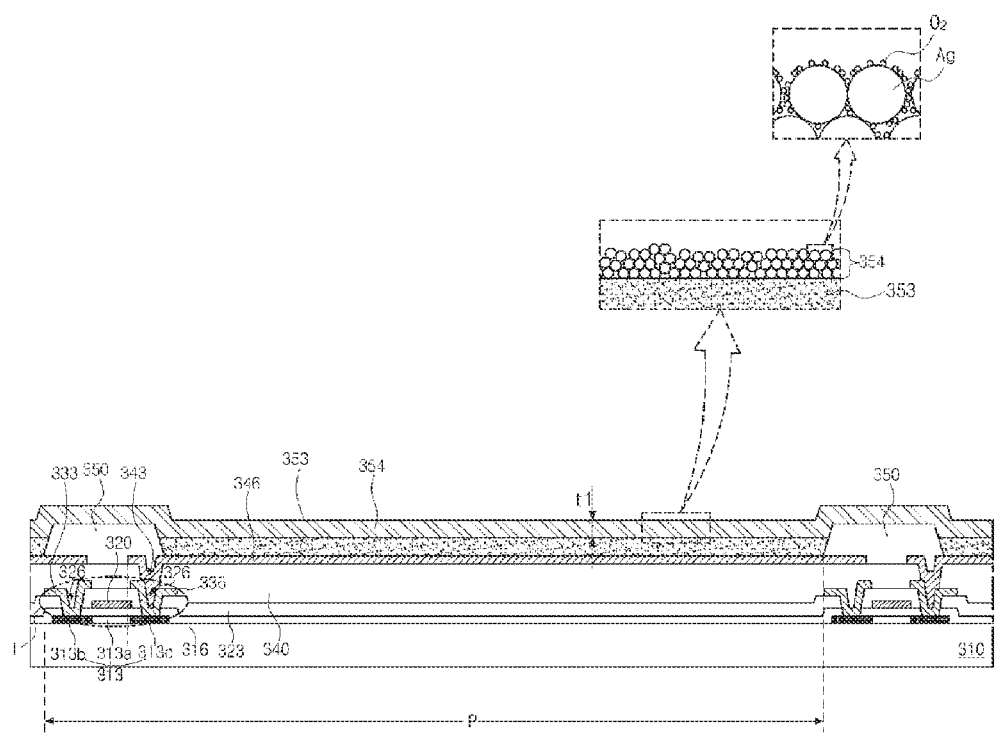

In FIG. 14B, a metallic material layer 354 having a first thickness t1 is formed on the emitting layer 353. The metallic material layer 354 may include a metallic material having a relatively low work function to function. For example, the metallic material layer 354 may silver (Ag) or silver alloy having silver and at least one of magnesium (Mg), aluminum (Al) and copper (Cu). The silver alloy may be one of magnesium silver (MgAg) alloy, aluminum silver (AlAg) alloy, copper silver (CuAg) alloy, magnesium aluminum silver (MgAlAg) alloy, magnesium copper silver (MgCuAg) alloy, aluminum copper silver (AlCuAg) alloy and magnesium aluminum copper silver (MgAlCuAg) alloy.

The first thickness t1 may be about 300 Å to about 1200 Å. When the metallic material layer 354 has a thickness smaller than about 300 Å, the second electrode 356 may have a sheet resistance greater than about 7Ω/□. When the metallic material layer 354 has a thickness greater than about 1200 Å, the second electrode 356 may have a transmittance smaller than about 45%.

Since the metallic material layer 354 may be formed through a thermal evaporation method, the emitting layer 353 is not deteriorated by the metallic material layer 354. However, since the metallic material layer 354 through the thermal evaporation method has a relatively low density, the metallic material layer 354 has vacancies between molecules and the vacancies of the metallic material layer 354 are filled with oxygen molecules. In addition, although silver is not easily oxidized under the air ambience, silver may be oxidized under ozone ($O_3$) ambience to form silver oxide ($Ag_2O$) having a transparency.

Silver may be oxidized according to the following chemical equation to form silver oxide:

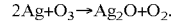

$$2Ag+O_3 \rightarrow Ag_2O+O_2.$$

When two molecules of silver (Ag) are combined with one molecule of ozone ($O_3$), one molecule of silver oxide ($Ag_2O$) and one molecule of oxygen ($O_2$) are generated. Since the oxygen of the metallic material layer 354 through a thermal evaporation method function as a precursor combined with the ozone, silver of the metallic material layer 354 may be easily oxidized under the ozone ambience.

Figure 14C:
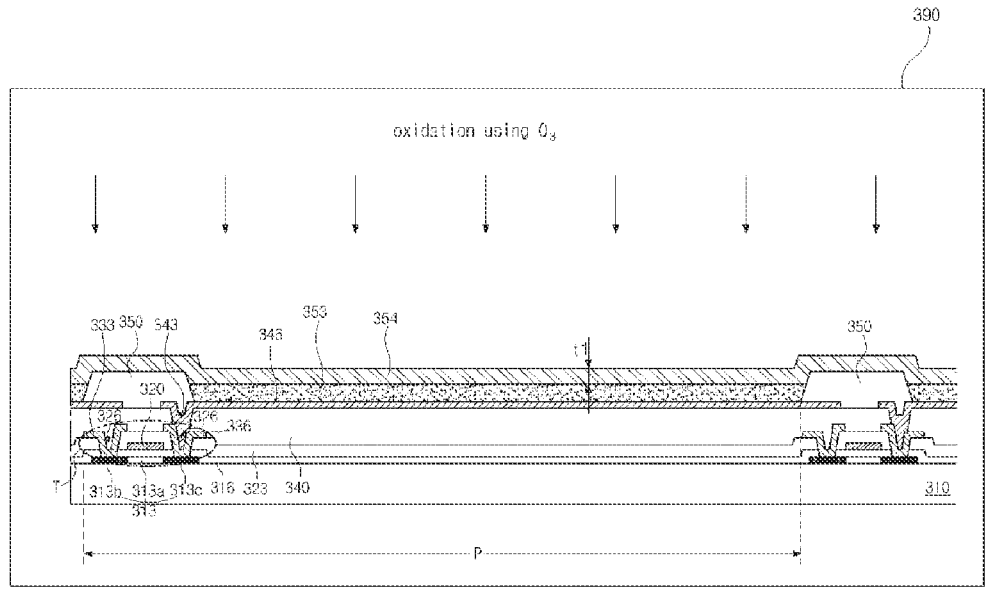

In FIG. 14C, the first substrate 310 having the metallic material layer 354 is loaded in an oxidation chamber 390 and the oxidation step is performed for the first substrate 310. During the oxidation step, the oxidation chamber 390 is filled with an ozone ($O_3$) gas and the metallic material layer 354 is exposed to the ozone gas for a predetermined time period. For example, the ozone gas may have a concentration of about 0.1 ppm to about 50 ppm in the oxidation chamber 390, and the predetermined time period for the oxidation step may be about 10 seconds to about 120 seconds.

During the oxidation step, the metallic material layer 354 is gradually oxidized from a top surface toward a bottom surface thereof. When the metallic material layer 354 is exposed to the ozone gas of a reference concentration of about 0.1 ppm to about 50 ppm for a reference time period of about 10 seconds to about 120 seconds, a thickness ratio of residual metallic material layer 356a (of FIG. 14D) and the oxidized metallic material layer 356b (of FIG. 14D) may be about 1:2 to about 1:5.

When the metallic material layer 354 is exposed to the ozone gas for a time period longer than a reference time period or to the ozone gas of a concentration greater than the reference concentration, the silver oxide may be further oxidized according to the following chemical equation to form silver oxide including silver of atomic value 1 or 3:

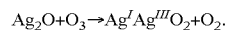

$$Ag_2O+O_3 \rightarrow Ag^I Ag^{III}O_2+O_2.$$

Since silver oxide including silver of atomic value 1 or 3 ($Ag^I$ or $Ag^{III}$) has a relatively low transmittance, transmittance of the second electrode 356 is reduced. As a result, in the oxidation step, the metallic material layer 354 is oxidized under the ozone gas of a reference concentration of about 0.1 ppm to about 50 ppm for a reference time period of about 10 seconds to about 120 seconds.

Figure 14D:
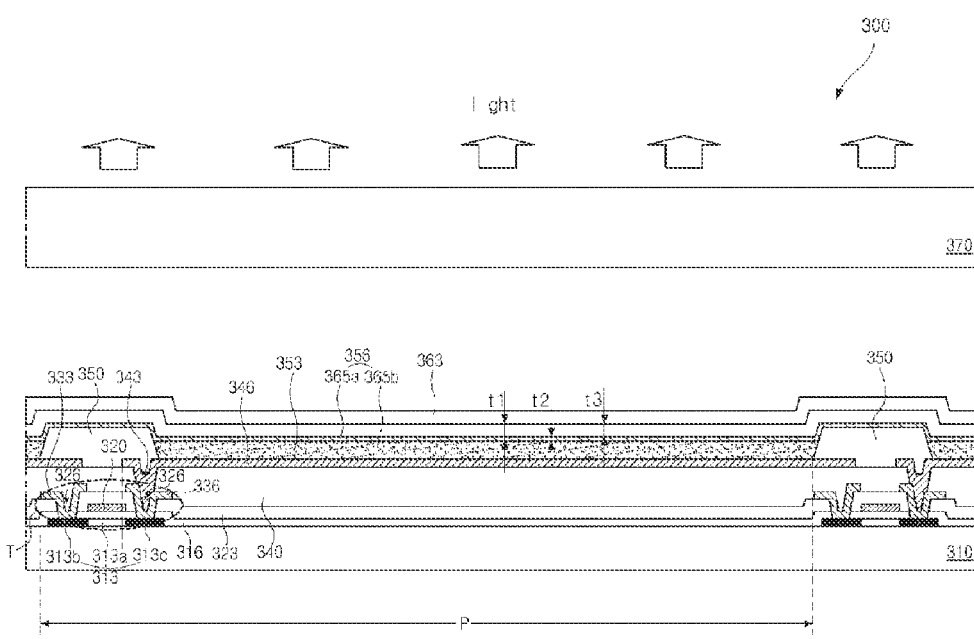

In FIG. 14D, after the oxidation step, a lower portion of the metallic material layer 354 remains to become the metal layer 356a having a second thickness t2 and an upper portion of the metallic material layer 354 is oxidized to become the oxide layer 356b having a third thickness t3. For example, the second thickness t2 may be about 100 Å to about 200 Å, and the third thickness t3 may be about 200 Å to about 1000 Å. As a result, the second electrode 356 including the metal layer 356a and the oxide layer 356b may have the first thickness t1 of about 300 Å to about 1200 Å.

Next, the capping layer 363 is formed on the second electrode 356, and the second substrate 370 is attached to the first substrate 310 using the seal pattern of an edge region or the seal layer of an entire region. The capping layer 363 may have a different refractive index from the oxide layer 356b of the second electrode 356. The seal or the seal layer may include an inorganic material, an organic material or a multiple layer of an inorganic material and an organic material.

In the OLED display device 300 of a top emission type according to the third embodiment of the present invention, the second electrode 356 includes the metal layer 356a of silver or silver alloy and the oxide layer 356b of silver oxide through the oxidation step to have a relatively low sheet resistance of about 1Ω/□ to about 7Ω/□ and a relatively high transmittance greater than about 45%. Since the transmission of the second electrode 356 is maximized and the voltage drop of the second electrode 356 is minimized, emission efficiency and uniformity in brightness of the OLED display device 300 are improved.

Although not shown, the aging step may be applied to the OLED display device 300 of a top emission type according to the third embodiment. For example, the reverse bias may be applied to the first and second electrodes 346 and 356 during the oxidation step. As a result, even when the first and second electrodes 346 and 356 directly contact each other due to the particle, an electrical shortage between the first and second electrodes 346 and 356 is prevented due to the oxide pattern generated by the oxidation and aging step where the reverse bias is applied to the first and second electrodes 346 and 356 under the ozone ambience. Accordingly, increase in power consumption and decrease in display quality due to deterioration such as a dark pixel are prevented.

It will be apparent to those skilled in the art that various modifications and variations can be made in an OLED display device according to the embodiments of the present invention without departing from the sprit or scope of the invention. Thus, it is intended that the present invention covers the modifications and variations of this invention provided they come within the scope of the appended claims and their equivalents.

What is claimed is:

1. An organic light emitting diode display device, comprising:
    a first substrate having a pixel region;
    a first electrode in the pixel region on the first substrate;
    an emitting layer disposed on the first electrode, the emitting layer including an emitting material layer;
    a second electrode disposed on the emitting layer, the second electrode including a first metal layer having a thickness smaller than about 300 Å; and
    a second metal layer disposed between the emitting material layer and the first metal layer of the second electrode, the second metal layer including at least one of cesium (Cs), sodium (Na), lithium (Li) or silver (Ag).

2. The display device according to claim 1, further comprising a capping layer on the second electrode, the capping layer having a refractive index greater than about 1.5.

3. The display device according to claim 1, wherein the first metal layer includes silver having a thickness of about 150 Å to about 250 Å, and the first metal layer has a plate structure.

4. The display device according to claim 1, wherein the second metal layer is an alloy layer of the second electrode, and the alloy layer includes one of magnesium silver (MgAg) alloy and cesium silver (CsAg) alloy.

5. The display device according to claim 1, wherein the first metal layer includes one of silver and silver alloy, and wherein the second electrode further includes an oxide layer on the first metal layer, and the oxide layer includes silver oxide.

6. The display device according to claim 2, wherein the capping layer includes at least one of an inorganic material, an organic material or a metal oxide.

7. The display device according to claim 3, wherein the second metal layer is an electron injecting layer of the emitting layer, and the electron injecting layer includes at least one of cesium (Cs), sodium (Na), lithium (Li), tungsten (W) or magnesium (Mg).

8. The display device according to claim 4, wherein the first metal layer has a thickness of about 50 Å to about 300 Å, and the alloy layer has a thickness of about 2 Å to about 200 Å.

9. The display device according to claim 5, wherein the first metal layer has a thickness of about 100 Å to about 200 Å, and the oxide layer has a thickness of about 200 Å to about 1000 Å.

10. The display device according to claim 5, wherein the silver alloy includes one of magnesium silver (MgAg) alloy, aluminum silver (AlAg) alloy, copper silver (CuAg) alloy, magnesium aluminum silver (MgAlAg) alloy, magnesium copper silver (MgCuAg) alloy, aluminum copper silver (AlCuAg) alloy and magnesium aluminum copper silver (MgAlCuAg) alloy.

11. An organic light emitting diode display device, comprising:
    a first substrate including a pixel region;
    a first electrode disposed in the pixel region;
    an emitting layer including an emitting material layer disposed on the first electrode; and
    a second electrode disposed on the emitting layer, the second electrode including a first metal layer having a thickness smaller than about 300 Å and a second metal layer disposed between the emitting material layer and the first metal layer, the second metal layer including at least one of cesium (Cs), sodium (Na), lithium (Li), tungsten (W), magnesium (Mg) or silver (Ag),
    wherein the emitting layer exposes the first electrode, and an oxide pattern is disposed between the first electrode exposed through the emitting layer and the second electrode.

12. A method of fabricating an organic light emitting diode display device, the method comprising:
   forming a first electrode in a pixel region on a first substrate;
   forming an emitting layer on the first electrode;
   forming a second electrode on the emitting layer, the second electrode including a metal layer having a thickness smaller than about 300 Å; and
   applying a low level voltage and a high level voltage to the first and second electrodes, respectively, under one of an oxygen ambience and an ozone ambience,
   wherein an oxide pattern is formed between the first electrode exposed through the emitting layer and the second electrode by the low level voltage and the high level voltage.

13. The method according to claim 12, further comprising forming a capping layer on the second electrode, the capping layer having a refractive index greater than about 1.5.

14. The method according to claim 12, wherein a difference between the low level voltage and the high level voltage is about 5V to about 20V, and the low level voltage and the high level voltage are applied for about 30 seconds to about 60 seconds.

15. The method according to claim 12, wherein the metal layer includes silver, and the silver is deposited with a deposition rate of about 1.0 Å/s to about 2.0 Å/s.

16. The method according to claim 12, wherein the forming the second electrode comprises:
   forming an alloy layer on the emitting layer, the alloy layer including one of magnesium silver (MgAg) alloy and cesium silver (CsAg) alloy; and
   forming the metal layer on the alloy layer.

17. The method according to claim 12, wherein the forming the second electrode comprises:
   forming a metallic material layer on the emitting layer; and
   forming the metal layer and an oxide layer on the metal layer by oxidizing the metallic material layer using an ozone gas.

18. The method according to claim 17, wherein the ozone gas has a concentration of about 0.1 ppm to about 50 ppm, and the metallic material layer is exposed to the ozone gas for about 10 seconds to about 120 seconds.

* * * * *